US012696512B2

(12) United States Patent
Chang et al.

(10) Patent No.: US 12,696,512 B2
(45) Date of Patent: Jul. 28, 2026

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Lo-Heng Chang, Hsinchu (TW); Yu-Xuan Huang, Hsinchu City (TW); Lin-Yu Huang, Hsinchu (TW); Huan-Chieh Su, Changhua County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 938 days.

(21) Appl. No.: 17/871,645

(22) Filed: Jul. 22, 2022

(65) Prior Publication Data

US 2024/0030310 A1     Jan. 25, 2024

(51) Int. Cl.
| | |
|---|---|
| *H10D 64/01* | (2025.01) |
| *H10D 30/01* | (2025.01) |
| *H10D 30/62* | (2025.01) |
| *H10D 30/67* | (2025.01) |
| *H10D 62/10* | (2025.01) |
| *H10P 50/28* | (2026.01) |

(52) U.S. Cl.
CPC ......... *H10D 64/015* (2025.01); *H10D 30/024* (2025.01); *H10D 30/6219* (2025.01); *H10D 30/6735* (2025.01); *H10D 62/121* (2025.01); *H10P 50/282* (2026.01); *H10D 30/6757* (2025.01)

(58) Field of Classification Search
CPC .. H10D 64/015; H10D 62/121; H10D 30/024; H10D 30/6735; H10D 30/6219
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,978,773 | B2 * | 5/2024 | Su .................... H01L 21/76897 |

(Continued)

*Primary Examiner* — Christine A Enad
(74) *Attorney, Agent, or Firm* — Maschoff Brennan

(57) ABSTRACT

A method includes forming first semiconductor layers vertically stacked over a substrate; forming a gate structure over the first semiconductor layers; etching portions of the first semiconductor layers and the substrate uncovered by the substrate to form recesses; forming a spacer layer covering sidewalls of portions of the first semiconductor layers, while a bottommost one of the first semiconductor layers is uncovered by the spacer layer; etching the bottommost one of the first semiconductor layers to form a gap; forming a blocking dielectric in the gap; and forming source/drain epitaxy structures in the recesses and on opposite sides of the gate structure.

20 Claims, 24 Drawing Sheets

(56)　　　　　　　References Cited

U.S. PATENT DOCUMENTS

| | | | | |
|---|---|---|---|---|
| 2021/0134795 | A1* | 5/2021 | Ju | ......................... H10D 64/518 |
| 2021/0359125 | A1* | 11/2021 | Liang | ................... H10D 62/151 |
| 2022/0310804 | A1* | 9/2022 | Su | ..................... H01L 21/76897 |

* cited by examiner

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
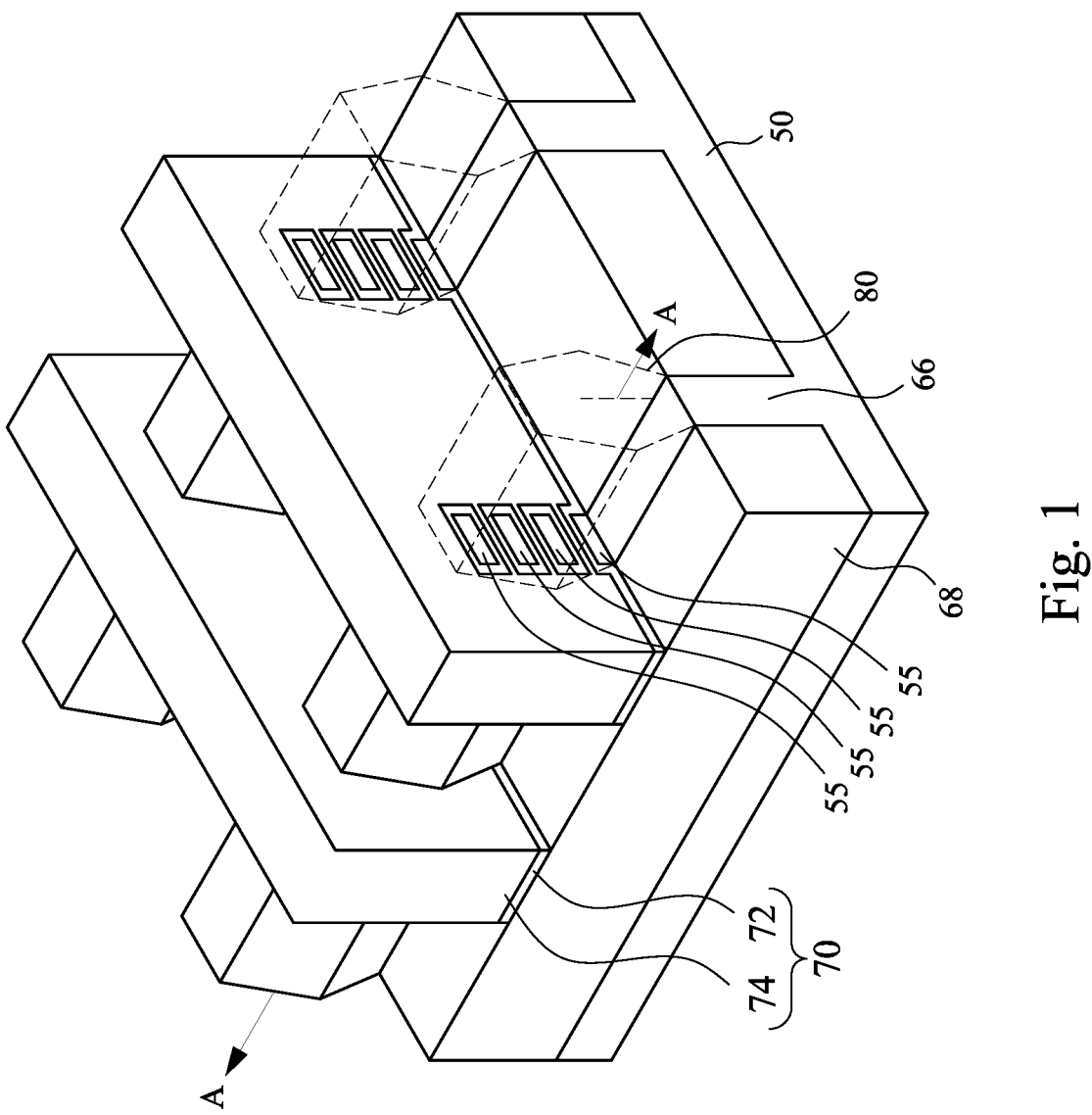
FIG. 1 illustrates an example of nano-FETs in a three-dimensional view in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs include semiconductor layers 55 over semiconductor strips 66 on a substrate 50 (e.g., a semiconductor substrate), wherein the semiconductor layers 55 act as channel regions for the nano-FETs. In some embodiments, the semiconductor layers 55 can also be referred to as nanostructures, nanosheets, nanowires, or the like. The semiconductor layer 55 may include p-type nanostructures, n-type nanostructures, or a combination thereof. Isolation structures 68 are disposed between adjacent semiconductor strips 66, which may protrude above and from between neighboring isolation structures 68. Additionally, although a bottom portion of the semiconductor strips 66 are illustrated as being single, continuous materials with the substrate 50, the bottom portion of the semiconductor strips 66 and/or the substrate 50 may include a single material or a plurality of materials. In this context, the semiconductor strips 66 refer to the portion extending between the neighboring isolation structures 68.

Gate dielectric layers 72 are over the semiconductor strips 66 and along top surfaces, sidewalls, and bottom surfaces of the semiconductor layers 55. Gate electrodes 74 are over the gate dielectric layers 72. The gate dielectric layer 72 and the gate electrode 74 can be collectively referred to as a gate structure 70.

Epitaxial source/drain structures 80 are disposed over the semiconductor strips 66, and on opposing sides of the gate structure 70. The gate structure 70 serves as a gate region of the transistor, the epitaxial source/drain structures 80 serve as source/drain regions of the transistor, and the semiconductor layers 55 serve as channel region of the transistor. Here, the source/drain epitaxy structures may refer to a source or a drain, individually or collectively dependent upon the context.

FIG. 1 further illustrates reference cross-section that are used in later figures. Cross-section A-A is parallel to a longitudinal axis of a semiconductor strip 66 of the nano-FET and in a direction of, for example, a current flow between the epitaxial source/drain structures 80 of the nano-FET.

FIGS. 2 to 16 are cross-sectional views of intermediate stages in the manufacturing of a semiconductor device, in accordance with some embodiments. In greater details, the cross-sectional views of FIGS. 2 to 16 are the same as the reference cross-section A-A as illustrated in FIG. 1.

Figure 2:
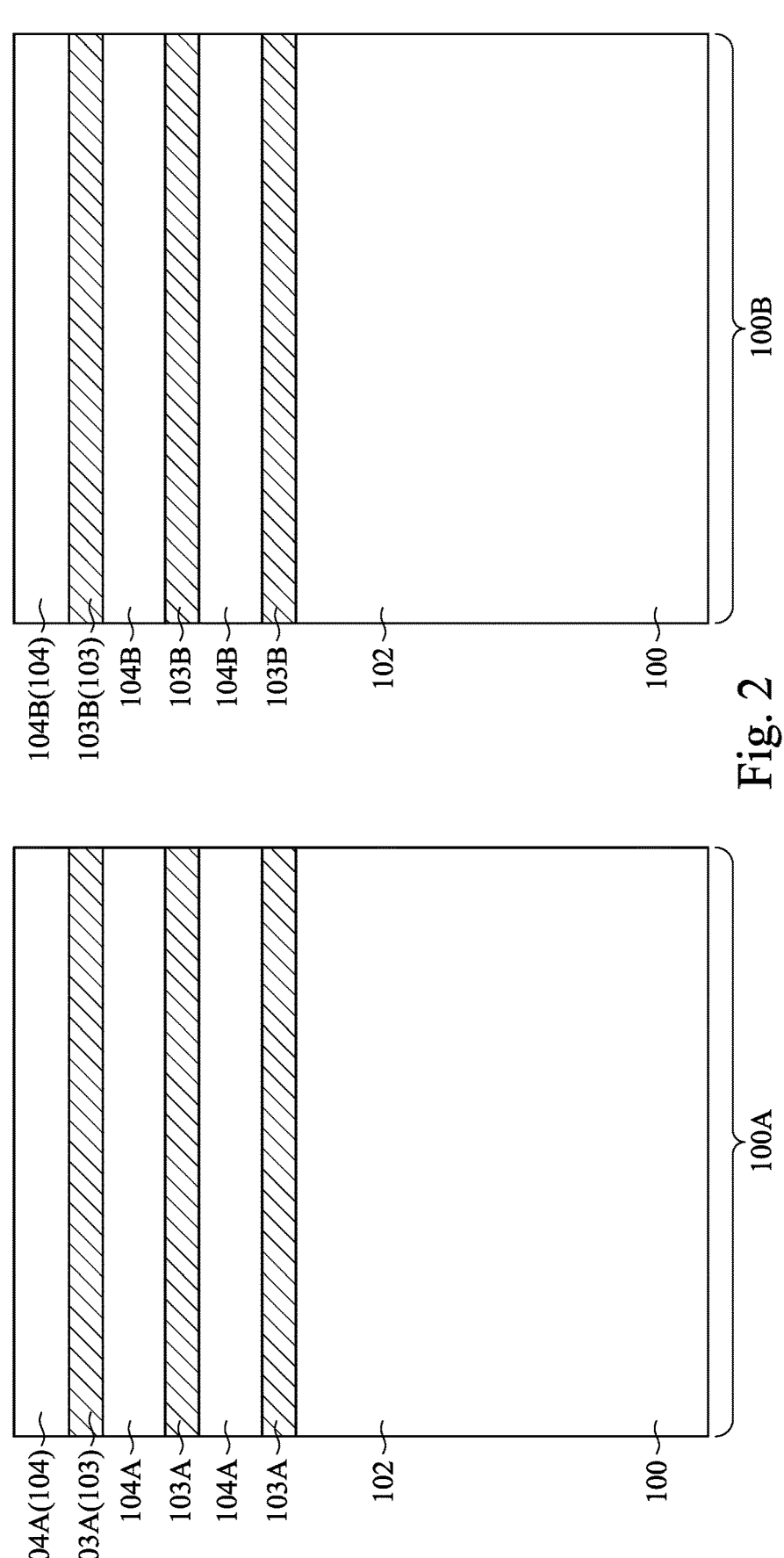
FIGS. 2 to 16 are cross-sectional views of intermediate stages in the manufacturing of a semiconductor device, in accordance with some embodiments.

Reference is made to FIG. 2. Shown there is a substrate 100, which includes a first region 100A and a second region 100B. Generally, the substrate 100 illustrated in FIG. 2 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $GaxAl_{1-x}As$, $GaxAl_{1-x}N$, $InxGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The substrate 100 may include a semiconductor strip 102, which is similar to the semiconductor strip 66 as described with respect to FIG. 1.

A plurality of semiconductor layers 103 and semiconductor layers 104 are alternately deposited over the semiconductor strip 102 of substrate 100. In some embodiments, portions of the semiconductor layers 103 and semiconductor layers 104 within the first region 100A of the substrate 100 are referred to as semiconductor layers 103A and semiconductor layers 104A, respectively. Similarly, portions of the semiconductor layers 103 and semiconductor layers 104 within the second region 100B of the substrate 100 are referred to as semiconductor layers 103B and semiconductor layers 104B, respectively.

The semiconductor layers 103 and the semiconductor layers 104 have different materials and/or components, such that the semiconductor layers 103 and the semiconductor layers 104 have different etching properties. In some embodiments, the semiconductor layers 103 are made from SiGe. The germanium percentage (atomic percentage concentration) of the semiconductor layers 103 is in the range between about percent and about 20 percent, while higher or lower germanium percentages may be used. It is appreciated, however, that the values recited throughout the description are examples, and may be changed to different values. For example, the semiconductor layers 103 may be $Si_{0.8}Ge_{0.2}$ or $Si_{0.9}Ge_{0.1}$, in which the proportion between Si and Ge may vary from embodiments, and the disclosure is not limited thereto. The semiconductor layers 104 may be pure silicon layers that are free of germanium. The semiconductor layers 104 may also be substantially pure silicon layers, for example, with a germanium percentage lower than about 1 percent. In some embodiments, the semiconductor layers 103 have a higher germanium atomic percentage concentration than the semiconductor layers 104. The semiconductor layers 103 and 104 may be formed by chemical vapor deposition (CVD), molecular beam epitaxy (MBE), or other suitable process(es). In some embodiments, the semiconductor layers 103 and 104 are formed by an epitaxy growth process, and thus the semiconductor layers 103 and 104 can also be referred to as epitaxial layers in this content.

In some embodiments, the semiconductor layers 103, the semiconductor layers 104, and the semiconductor strip 102 can be formed by, for example, alternately depositing layers of semiconductor layers 103 and 104 over the substrate 100, patterning the layers of semiconductor layers 103 and 104, and the substrate 100. As a result of the patterning process, semiconductor strips 102 are formed protruding over the substrate 100. In some embodiments, the semiconductor layers 103, 104 and the substrate 100 may be patterned using suitable processes including photolithography and etch processes. In some embodiments, each semiconductor strip 102 and the overlying semiconductor layers 103 and 104 can be collectively referred to as a fin structure.

In some embodiments, isolation structures (not shown), which are similar to the isolation structures 68 as described with respect to FIG. 1, may be formed over the substrate 100 and laterally surrounding the semiconductor strips 102. The isolation structures may be shallow trench isolation (STI) structures, suitable isolation structures, combinations of the foregoing, or the like. In some embodiments, the isolation structures may be made of oxide (e.g., silicon oxide) or nitride (e.g., silicon nitride).

Figure 3:
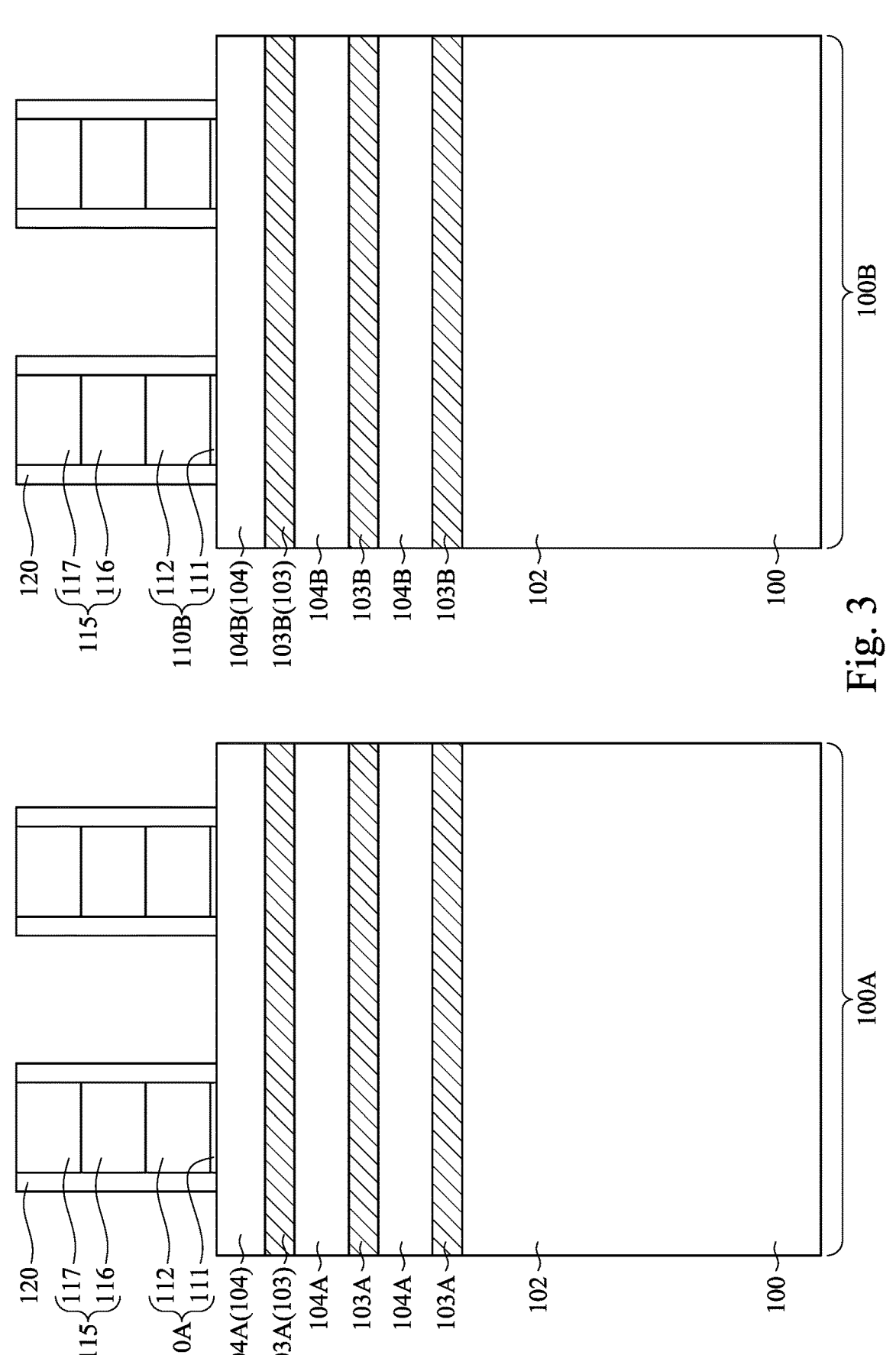

Reference is made to FIG. 3. Dummy gate structures 110A and 110B are formed over the first region 100A of the substrate 100 and the second region 100B of the substrate 100, respectively. In greater details, the dummy gate structures 110A are formed over the first region 100A of the substrate 100 and crossing the stack of the semiconductor layers 103A and 104A. The dummy gate structures 110B are formed over the second region 100B of the substrate 100 and crossing the stack of the semiconductor layers 103B and 104B. In some embodiments, patterned masks 115 may be formed over the dummy gate structures 110A and 110B, respectively.

In some embodiments, each of the dummy gate structures 110A and 110B includes a dummy gate dielectric 111 and a dummy gate electrode 112 over the dummy gate dielectric 111. The dummy gate dielectric 111 may be, for example, silicon oxide, silicon nitride, a combination thereof, or the like, and may be deposited or thermally grown according to acceptable techniques. The dummy gate electrode 112 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate electrode 112 and the dummy gate dielectric 111 may be formed by, for example, depositing a dummy dielectric layer and a dummy gate layer over the substrate, forming the patterned masks 115 over the dummy gate layer, and then performing a patterning process to the dummy dielectric layer and the dummy gate layer by using the patterned masks 115 as an etching mask. In some embodiments, the dummy gate electrode 112 may be deposited by physical vapor deposition (PVD), CVD, sputter deposition, or other techniques for depositing the selected material. In some embodiments, the dummy gate dielectric 111 may be formed by thermal oxidation.

In some embodiments, the each of the patterned masks 115 includes a first hard mask 116 and a second hard mask 117 over the first hard mask 116. The first hard mask 116 and the second hard mask 117 may be made of different materials. In some embodiments, the first hard mask 116 may be formed of silicon nitride, and the second hard mask 117 may be formed of silicon oxide.

Gate spacers 120 are formed on opposite sidewalls of the dummy gate structures 110A and 110B, respectively. In some embodiments, the gate spacers 120 may be formed by, for example, depositing a spacer material blanket over the dummy gate structures 110A and 110B, and subsequently performing an etching process to remove horizontal portions of the spacer material, such that vertical portions of the spacer material remains on sidewalls of the dummy gate structures 110A and 110B. The gate spacers 120 may be formed of silicon oxide, silicon nitride, silicon oxynitride, combinations thereof, using techniques such as thermal oxidation or deposited by CVD, ALD, or the like.

Figure 4:
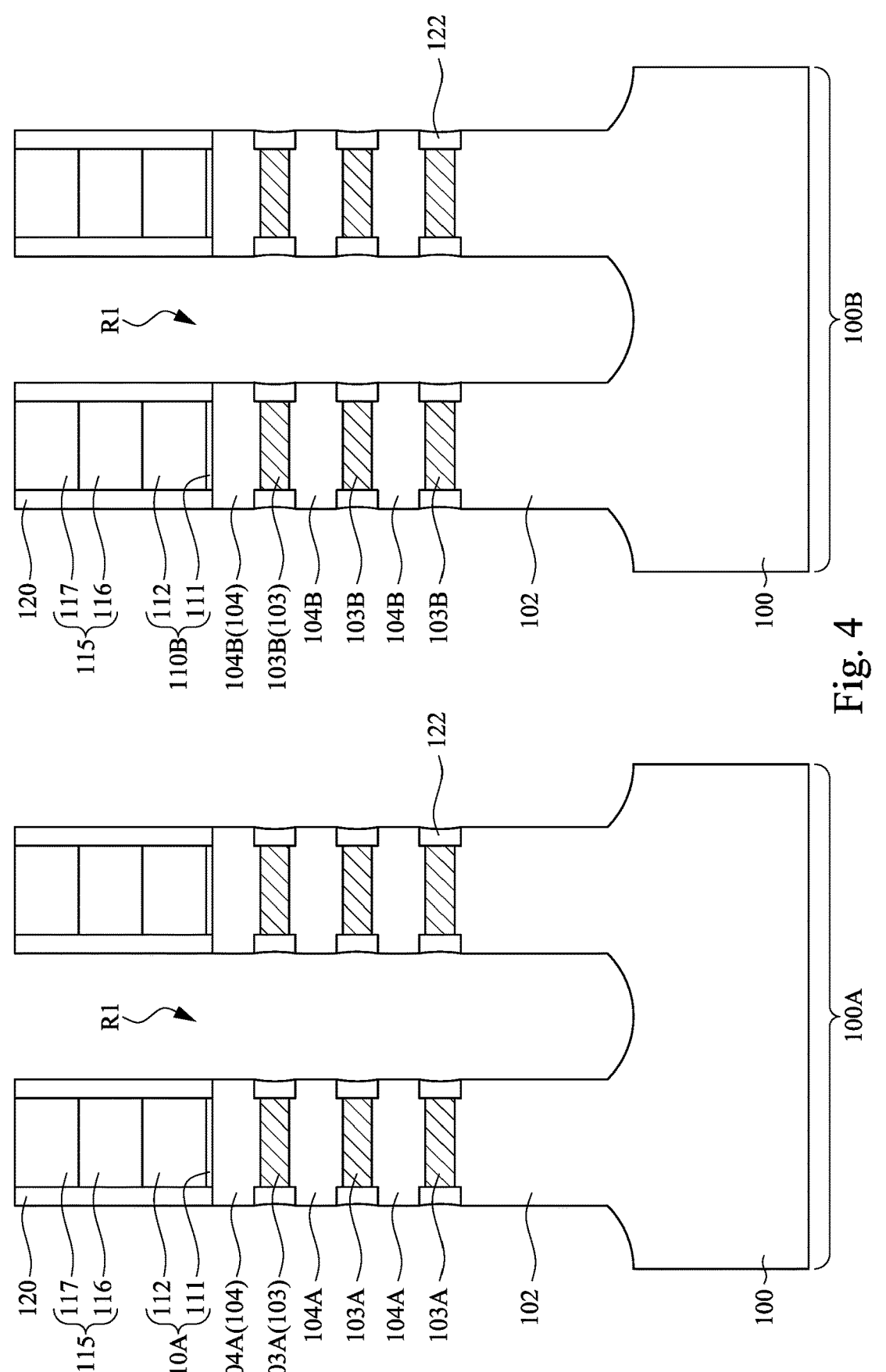

Reference is made to FIG. 4. An etching process may be performed to remove portions of the stack of the semiconductor layers 103A and 104A that are uncovered by the dummy gate structures 110A and the gate spacers 120, and to remove portions of the stack of the semiconductor layers 103B and 104B that are uncovered by the dummy gate structures 110B and the gate spacers 120, so as to form recesses R1. In some embodiments, the bottommost ends of the recesses R1 may be lower than bottom surfaces of the bottommost semiconductor layers 103A and 103B. After the etching process is completed, each of the semiconductor layers 104A and 104B under the corresponding gate structures 110A and 110B may include a thickness in a range from about 2 nm to about 8 nm.

Afterwards, portions of the semiconductor layers 103A and 103B exposed by the recesses R1 are laterally etched to form sidewall recesses, and then inner spacers 122 are formed in the sidewall recesses. In some embodiments, the sidewalls of the semiconductor layers 103A and 103B may be etched using isotropic etching processes, such as wet etching or the like. In some embodiments in which the semiconductor layers 103A and 103B include, e.g., SiGe, and the semiconductor layers 104A and 104B include, e.g., Si, a dry etch process with tetramethylammonium hydroxide (TMAH), ammonium hydroxide (NH$_4$OH), or the like may be used to etch sidewalls of the semiconductor layers 103A and 103B.

The inner spacers 122 may be deposited by a conformal deposition process, such as CVD, ALD, or the like. The inner spacer layer may include a material such as SiN, SiOCN, SiCN, SIOC, although any suitable material, such as low-dielectric constant (low-k) materials having a k-value less than about 3.5, may be utilized. The inner spacers 122 may be formed by, for example, depositing an inner spacer layer blanket over the substrate 100 and filling the sidewall recesses of the semiconductor layers 103A and 103B, and then performing an anisotropic etching to remove portions of the inner spacer layer outside the sidewall recesses. In some embodiments, the width of each inner spacer 122 is in a range from about 1 nm to about 5 nm.

Figure 5:
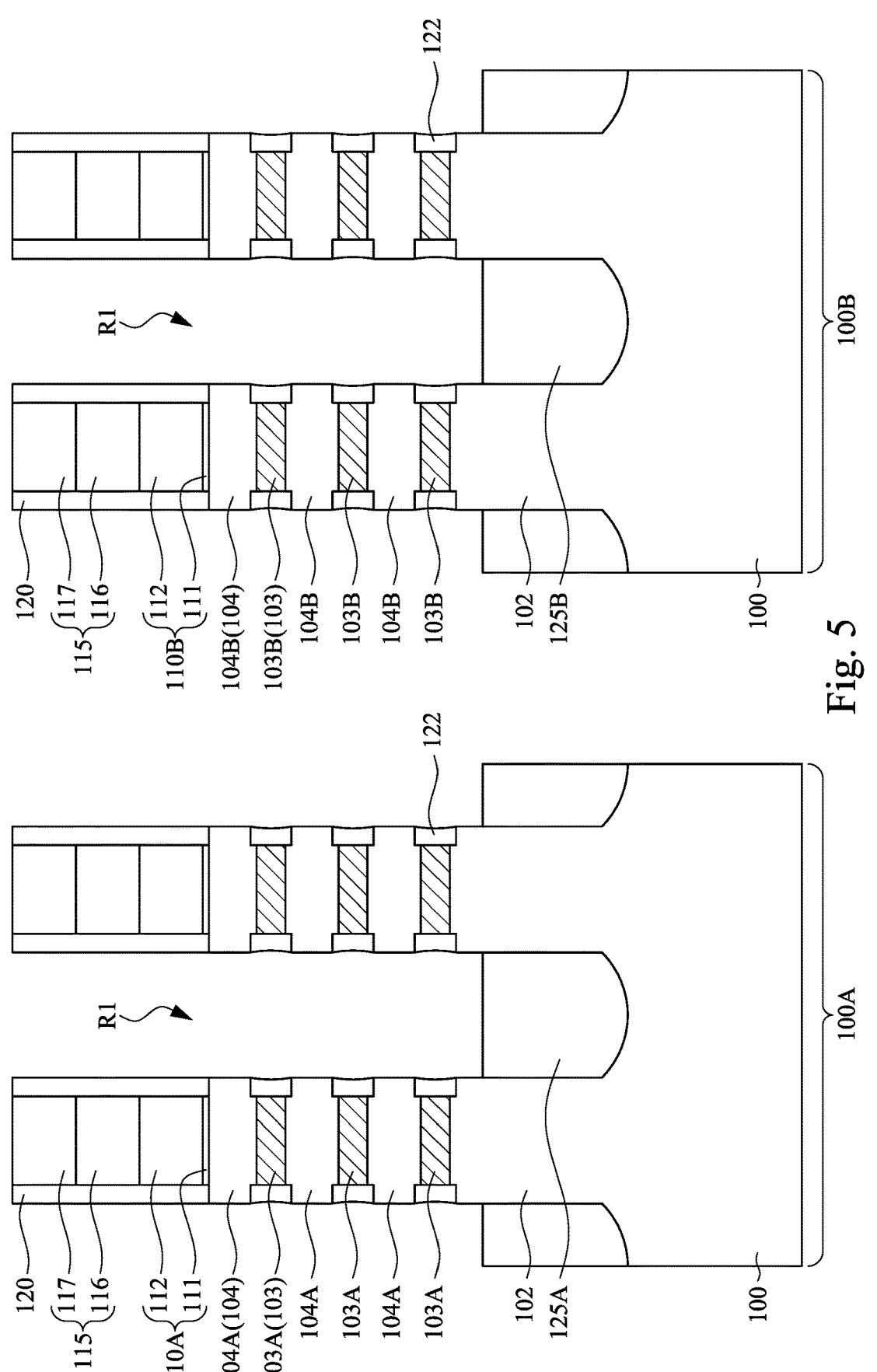

Reference is made to FIG. 5. Semiconductor materials 125A and 125B are formed in the recesses R1. In greater details, the semiconductor materials 125A are formed in the recesses R1 within the first region 100A of the substrate 100, and the semiconductor materials 125B are formed in the recesses R1 within the second region 100B of the substrate 100. In some embodiments, the semiconductor materials 125A and 125B are made from silicon germanium (SiGe). In some embodiments, the semiconductor materials 125A and 125B are made of a same material as the semiconductor layers 103A and 103B. In some embodiments, germanium atomic percentage of the semiconductor materials 125A and 125B is in a range from about 20% to about 50%.

In some embodiments, the formation of the semiconductor materials 125A and 125B may include a plurality of deposition cycles, in which each deposition cycle may include a selective epitaxial growth (SEG) process and an etching process. In some embodiments, the SEG process may selectively grow a semiconductor material on exposed semiconductor surfaces, such as the exposed surfaces of the semiconductor strip 102 of the substrate 100 and the exposed surfaces of the semiconductor layers 104A and 104B. However, because the exposed area of the semiconductor strip 102 of the substrate 100 is greater than the exposed area of each of the semiconductor layers 104A and 104B, the semiconductor material may include higher growing rate on the exposed area of the semiconductor strip 102 of the substrate 100 than on the exposed area of each of the semiconductor layers 104A and 104B. That is, a greater amount of the semiconductor material will be grown on the exposed area of the semiconductor strip 102 of the substrate 100 than on the exposed area of each of the semiconductor layers 104A and 104B. As a result, the etching process in each deposition cycle of the semiconductor materials 125A and 125B may remove portions of the semiconductor material formed on the exposed area of each of the semiconductor layers 104A and 104B, while portions of the semiconductor material may remain over the semiconductor strip 102 of the substrate 100 after the etching process. Accordingly, performing several deposition cycles may allow a bottom-up deposition for the semiconductor materials 125A and 125B. That is, the semiconductor materials 125A and 125B may be formed from the bottoms of the recesses R1 via a bottom-up manner.

Figure 6:
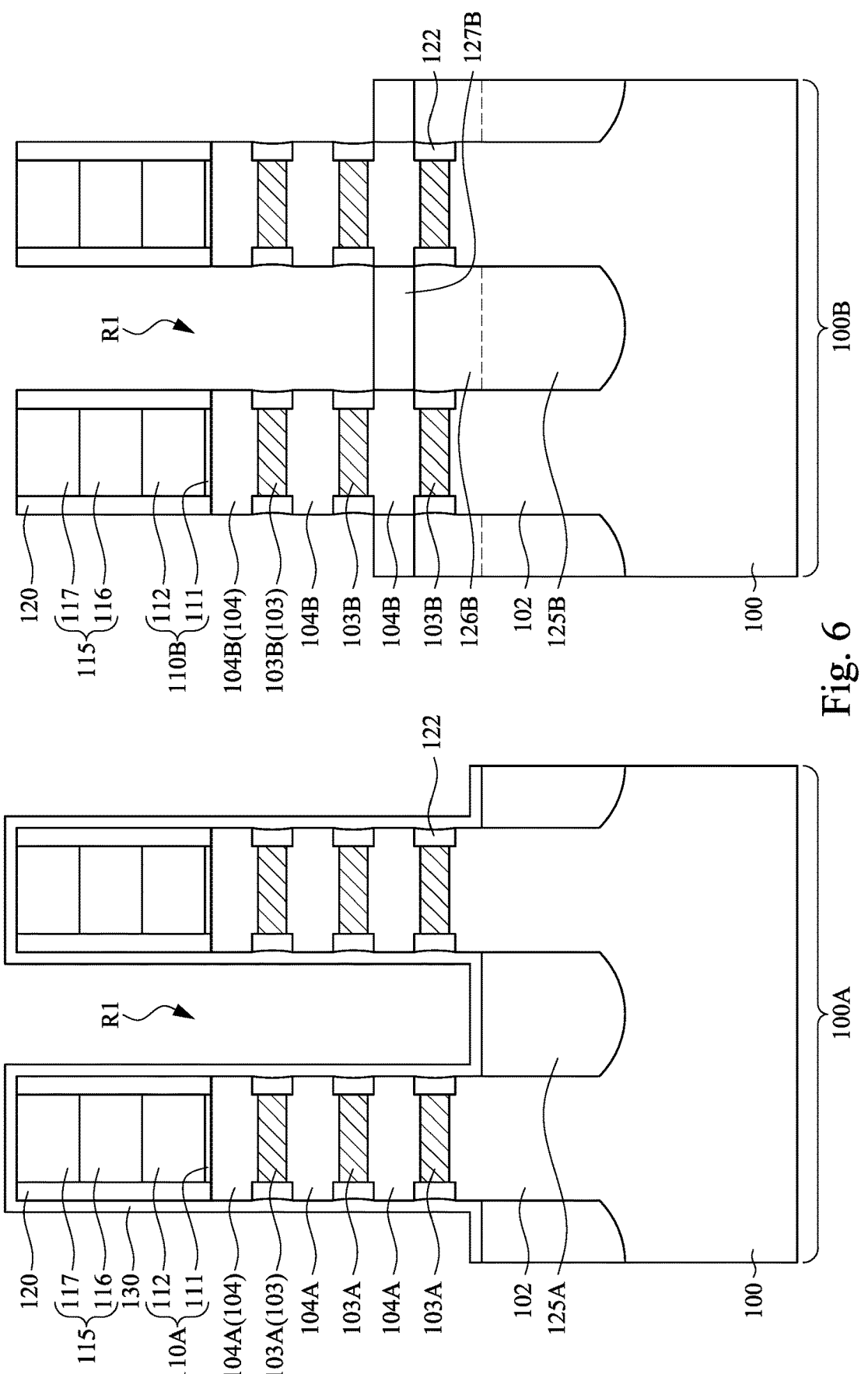

Reference is made to FIG. 6. A hard mask layer 130 is deposited covering the structures within the first region 100A of the substrate 100, while leaving the structures within the second region 100B of the substrate 100 uncovered by the hard mask layer 130. In greater details, the hard mask layer 130 is deposited covering the gate spacers 120, the semiconductor layers 104A, the inner spacers 122 between the semiconductor layers 104A, and the semiconductor materials 125A. In some embodiments, the hard mask layer 130 may be formed by, for example, depositing a layer of the hard mask layer 130 blanket over the substrate 100, and then patterning the layer to remove portion of the layer from the second region 100B of the substrate 100. In some embodiments, the hard mask layer 130 may include silicon oxide, silicon nitride, silicon oxynitride, combinations thereof, using techniques such as thermal oxidation or deposited by CVD, ALD, or the like.

Afterwards, semiconductor materials 126B are formed over the semiconductor materials 125B, respectively. In some embodiments, the semiconductor materials 126B are formed of a same material as the semiconductor materials 125B, such as silicon germanium (SiGe). In some embodiments, the semiconductor materials 126B may be formed using a bottom-up deposition similar to those described with respect to the semiconductor materials 125A and 125B. Accordingly, the semiconductor materials 126B can be formed from the semiconductor materials 125B via a bottom-up manner. In some embodiments, top surfaces of the semiconductor materials 126B are substantially level with top surfaces of the semiconductor layers 103B. The semiconductor materials 126B may be in contact with bottommost inner spacers 122. In some embodiments, each semiconductor material 126B and its underlying semiconductor material 125B may be collectively referred to as a semiconductor layer.

After the semiconductor materials 126B are formed, semiconductor materials 127B are formed over the semiconductor materials 126B. The semiconductor materials 127B may be pure silicon layers that are free of germanium. The semiconductor materials 127B may also be substantially pure silicon layers, for example, with a germanium percentage lower than about 1 percent. In some embodiments, the semiconductor materials 125B and 126B have a higher germanium atomic percentage concentration than the semiconductor materials 127B, so as to provide sufficient etching selectivity. In some embodiments, the semiconductor materials 127B may be formed using a bottom-up deposition similar to those described with respect to the semiconductor materials 125A and 125B. Accordingly, the semiconductor materials 127B can be formed from the semiconductor materials 126B via a bottom-up manner. In some embodiments, top surfaces of the semiconductor materials 127B are substantially level with top surfaces of the bottommost semiconductor layer 104B. In some embodiments, the semiconductor materials 127B at least cover sidewalls of the bottommost semiconductor layers 104B.

Figure 7:
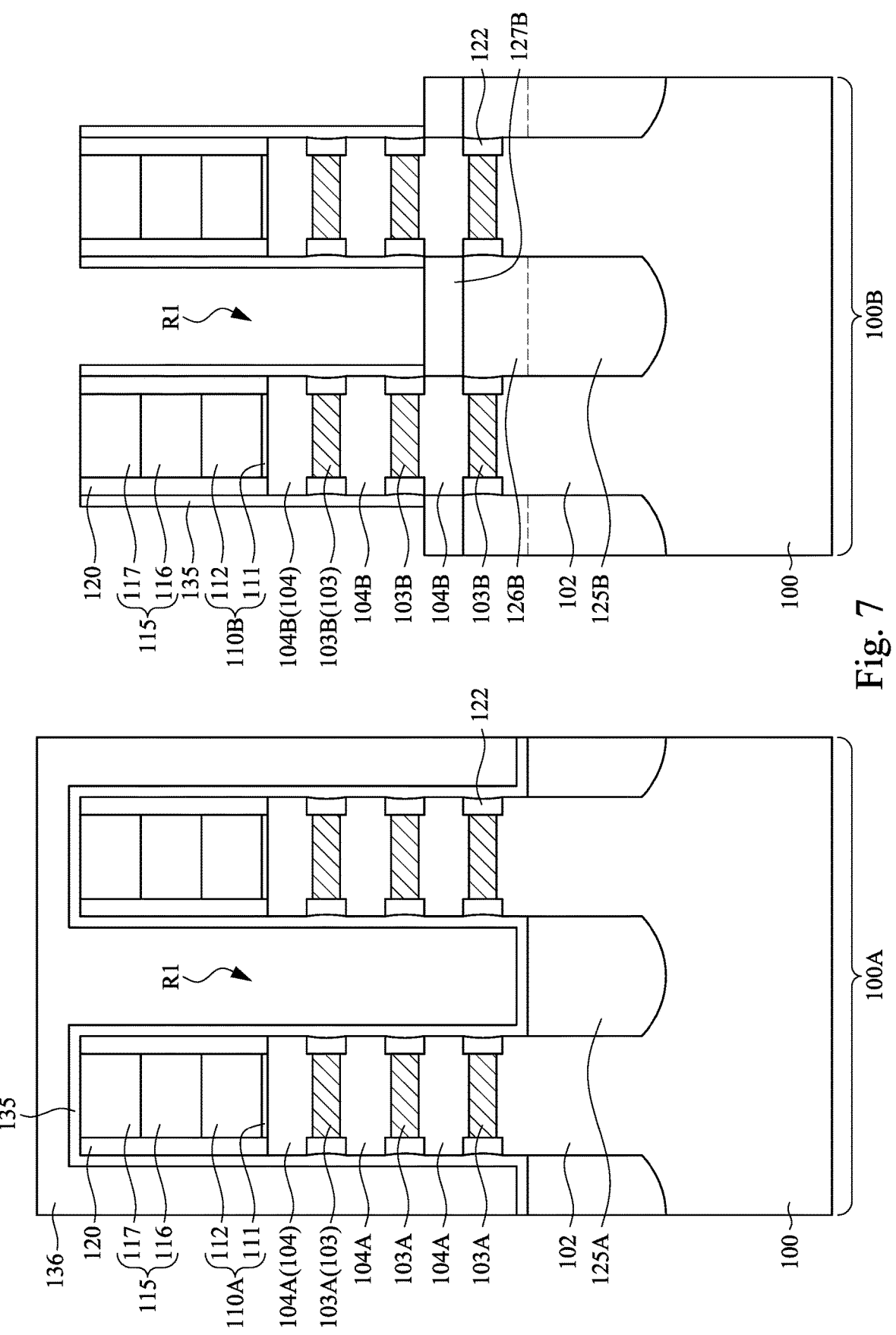

Reference is made to FIG. 7. After the semiconductor materials 127B are formed, the hard mask layer 130 is removed. In some embodiments, the hard mask layer 130 may be removed by suitable process, such as etching.

Afterwards, a spacer layer 135 is deposited over the substrate 100. In greater details, the spacer layer 135 may line the structures formed over the substrate 100, such as the semiconductor layers 104A/104B, the semiconductor materials 125A, the semiconductor materials 127B. In some embodiments, the spacer layer 135 may include silicon oxide, silicon nitride, silicon oxynitride, combinations thereof, using techniques such as thermal oxidation or deposited by CVD, ALD, or the like.

A patterned photoresist 136 is formed covering the structures within the first region 100A of the substrate 100, while leaving the structures within the second region 100B of the substrate 100 uncovered by the patterned photoresist 136. In greater details, the patterned photoresist 136 is formed to protect portion of the spacer layer 135 within the first region 100A of the substrate 100, while leaving portion of the spacer layer 135 within the second region 100B of the substrate 100 exposed.

Then, an anisotropic etching process, such as a dry etch, may be performing to remove horizontal portions of the spacer layer 135 within the second region 100B of the substrate 100. As a result, top surfaces of the patterned masks 115 and top surfaces of the semiconductor materials 127B are exposed. In some embodiments, the vertical portions of the spacer layer 135 within the second region 100B remaining covering the semiconductor layers 104B and the inner spacers 122 after the anisotropic etching process is completed. In some embodiments, during the anisotropic etching process, portion of the spacer layer 135 within the first region 100A of the substrate 100 is protected by the patterned photoresist 136.

Figure 8:
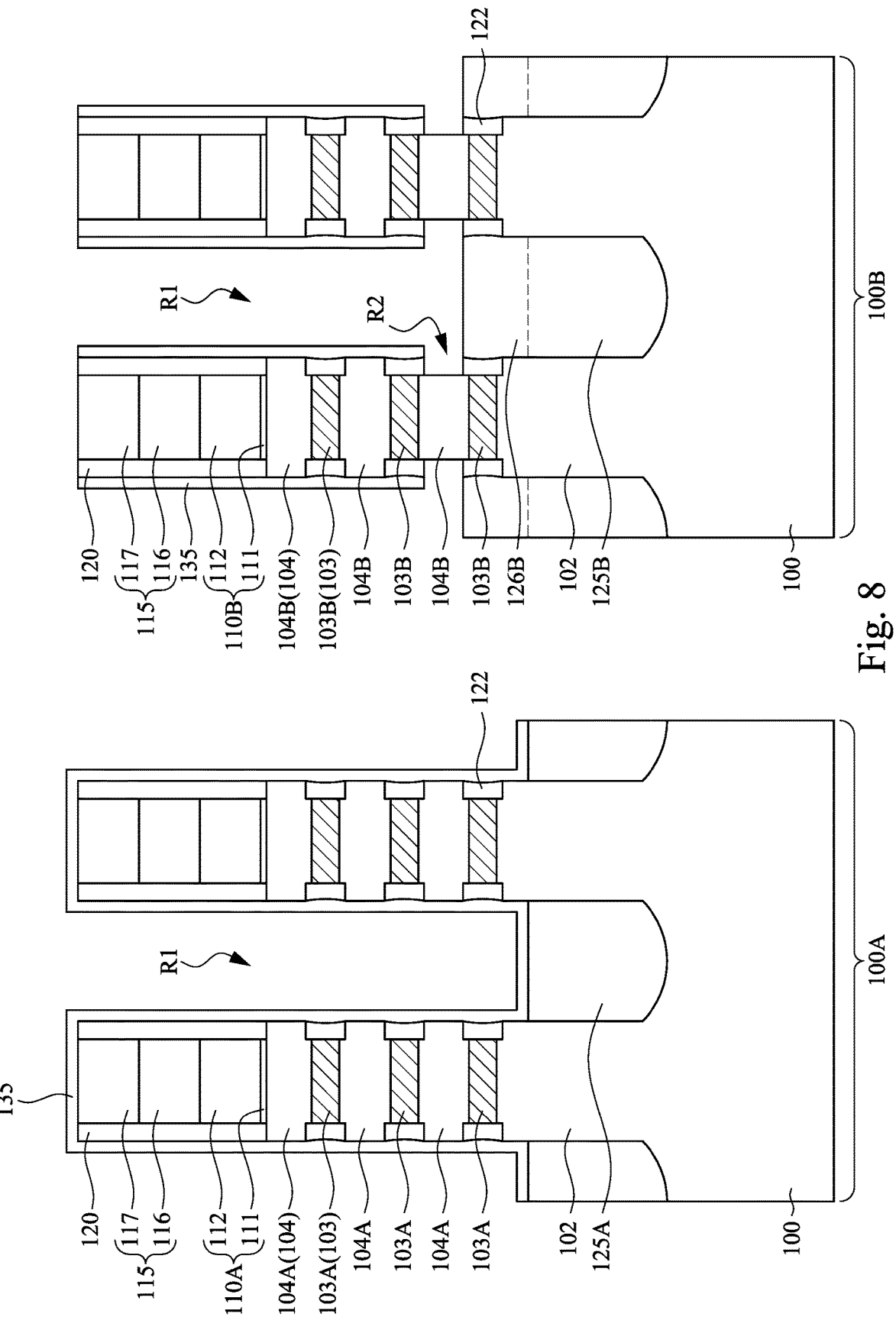

Reference is made to FIG. 8. The patterned photoresist 136 is removed to expose the portion of the spacer layer 135 within the second region 100B of the substrate 100. In some embodiments, the patterned photoresist 136 can be removed by suitable process, such as ashing or striping.

Then, an etching process is performed to remove the semiconductor materials 127B to expose the semiconductor layers 126. In some embodiments, because the semiconductor materials 127B and the semiconductor layers 104B may be made of a same material, such as silicon, the etching process may also etch the bottommost semiconductor layer 104B when the semiconductor materials 127B are removed. More specifically, because the bottommost semiconductor layer 104B are in contact with the semiconductor materials 127B, the bottommost semiconductor layer 104B may also be exposed to the etchant of the etching process when the semiconductor materials 127B are removed. In some embodiments, the bottommost semiconductor layer 104B may be shortened, such that the width of the bottommost semiconductor layer 104B may be less than the overlaying semiconductor layer 104B. Moreover, the width of the bottommost semiconductor layer 104B may be less than the bottommost semiconductor layer 104A, because the bottommost semiconductor layer 104A is protected by the spacer layer 135 during the etching process. In some embodiments, gaps R2 may be formed in the bottommost semiconductor layer 104B. In some embodiments, the spacer layer 135 has a higher etching resistance to the etching process than the semiconductor materials 127B and the semiconductor layers 104B, and thus the spacer layer 135 may protect the structures that are covered by the spacer layer 135, such as the semiconductor layers 104A and parts of the semiconductor layers 103B. in greater details, only the bottommost semiconductor layer 104B is etched, while other semiconductor layers 103B above the bottommost semiconductor layer 104B are protected by the spacer layer 135.

Figure 9:
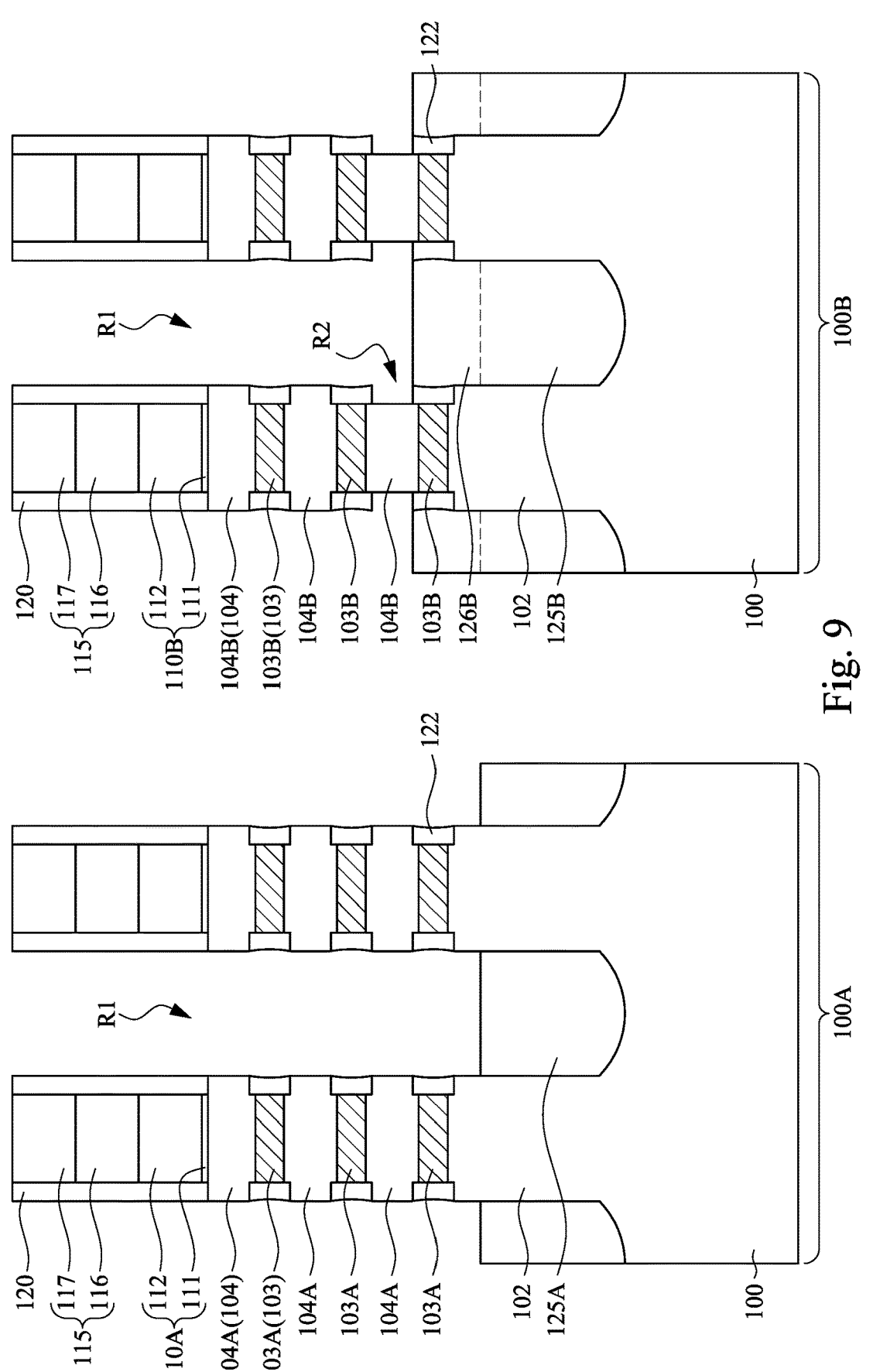

Reference is made to FIG. 9. The spacer layer 135 is removed by suitable process, such as etching. After the spacer layer 135 is removed, the semiconductor layers 104A and the semiconductor layers 103A are exposed.

Figure 10:
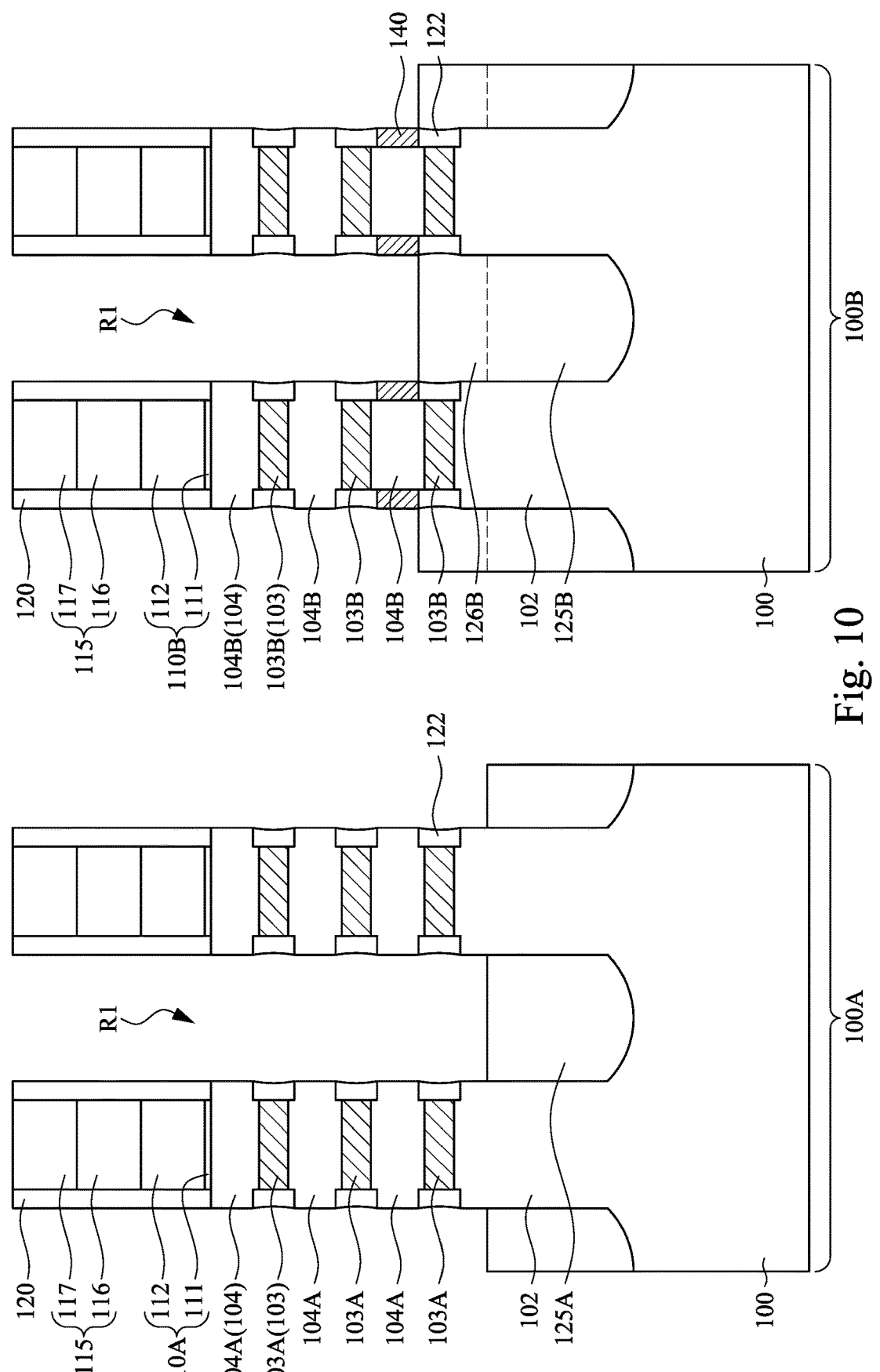

Reference is made to FIG. 10. Blocking dielectrics 140 are formed in the gaps R2 of the bottommost semiconductor layer 103B (see FIG. 9) and in contact with opposite sidewalls of the bottommost semiconductor layer 103B. In some embodiments, the blocking dielectrics 140 may be formed by, for example, depositing a dielectric material blanket over the substrate 100 and filling the gaps R2 of the bottommost semiconductor layer 103B, and then performing an etching process to remove portions of the dielectric material outside the gaps R2 of the bottommost semiconductor layer 103B. In some embodiments, each of the blocking dielectrics 140 may be vertically between two adjacent inner spacers 122. In some embodiments, the blocking dielectrics 140 may be made of SiN, SiOCN, SiCN, SIOC, or the like. In some embodiments, the width of each blocking dielectric 140 is in a range from about 1 nm to about 5 nm.

Figure 11:
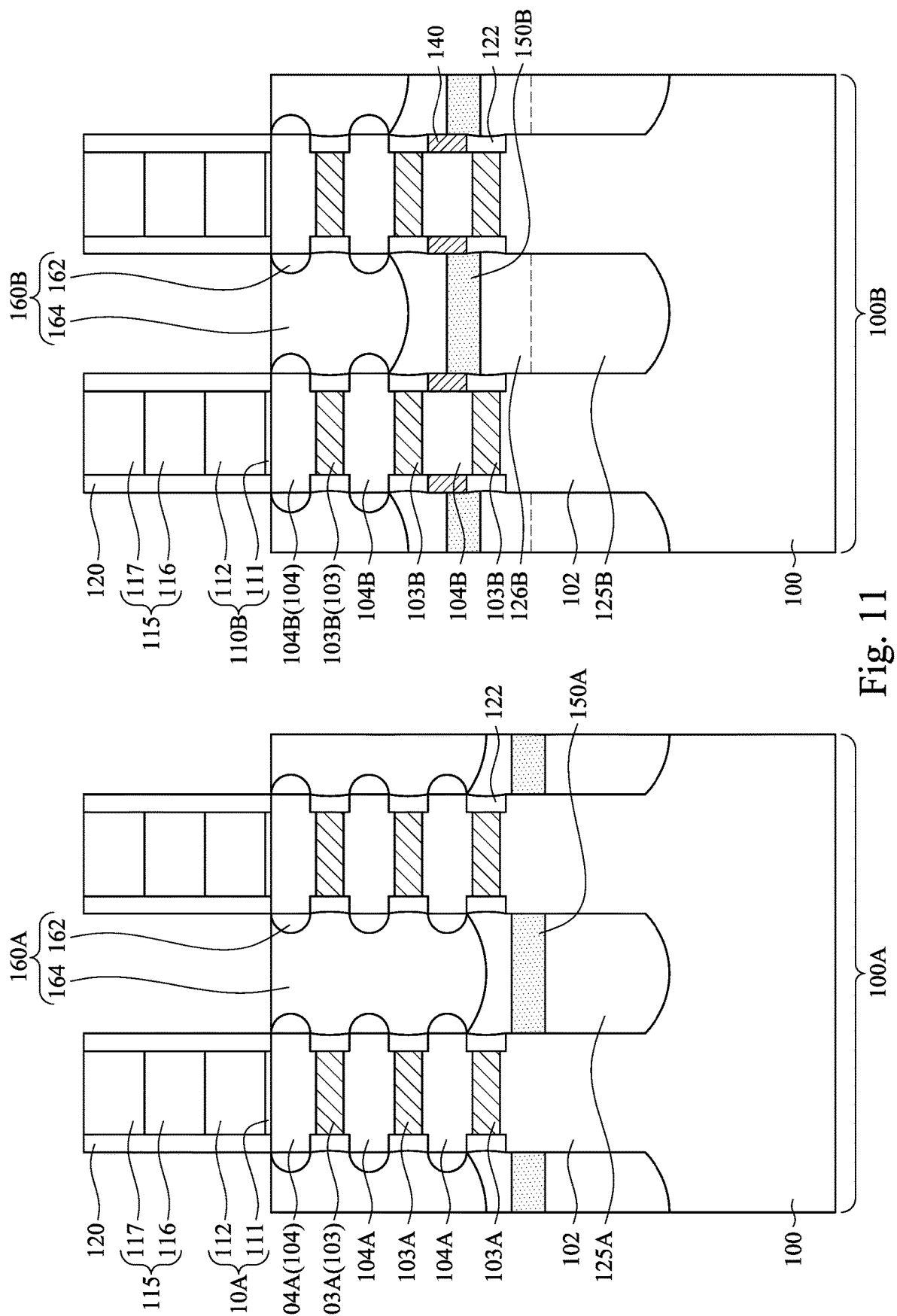

Reference is made to FIG. 11. Semiconductor caps 150A and 150B are formed over the semiconductor materials 125A and 126B, respectively. The semiconductor caps 150A and 150B may be pure silicon layers that are free of germanium. The semiconductor materials 127B may also be substantially pure silicon layers, for example, with a germanium percentage lower than about 1 percent. In some embodiments, the semiconductor materials 125A, 125B and 126B have a higher germanium atomic percentage concentration than the semiconductor caps 150A and 150B, so as to provide sufficient etching selectivity. In some embodiments, the semiconductor caps 150A and 150B may be formed using a bottom-up deposition similar to those described with respect to the semiconductor materials 125A and 125B. Accordingly, the semiconductor caps 150A and 150B can be formed from the semiconductor materials 125A and 126B via a bottom-up manner. In some embodiments, the semiconductor caps 150B may be in contact with the blocking dielectrics 140. In some embodiments, the thickness of the semiconductor caps 150A and 150B is in a range from about 2 nm to about 10 nm.

After the semiconductor caps 150A and 150B are formed, source/drain epitaxy structures 160A and 160B are formed over the substrate 100. In greater details, the source/drain epitaxy structures 160A are formed over the semiconductor strip 102 within the first region 100A of the substrate 100 and on opposite sides of the dummy gate structures 110A, and the source/drain epitaxy structures 160B are formed over the semiconductor strip 102 within the second region 100B of the substrate 100 and on opposite sides of the dummy gate structures 110B. Here, the source/drain epitaxy structures may refer to a source or a drain, individually or collectively dependent upon the context. In some embodiments, the source/drain epitaxy structures 160A and 160B may include p-type epitaxy material, such as SiGe, SiGeB, or the like. In some embodiments, the source/drain epitaxy structures 160A and 160B may include n-type epitaxy material, such as SiAs, SiP, or the like.

In some embodiments, the source/drain epitaxy structures 160A are in contact with the semiconductor caps 150A and the semiconductor layers 104A. On the other hand, the source/drain epitaxy structures 160B are in contact with the semiconductor caps 150B and the semiconductor layers 104B. However, the bottommost semiconductor layer 104B is separated from the source/drain epitaxy structures 160B by the blocking dielectrics 140.

In some embodiments, each of the source/drain epitaxy structures 160A and 160B may include a first epitaxial layer 162 and a second epitaxial layer 164 over the first epitaxial layer 162. In some embodiments, the material of the second epitaxial layer 164 can be as same as or similar to those of the first epitaxial layer 162. In some embodiments, the second epitaxial layer 164 may have a dopant concentration different from that of the first epitaxial layer 162. For example, the second epitaxial layer 164 may include higher dopant concentration than the first epitaxial layer 162.

Figure 12:
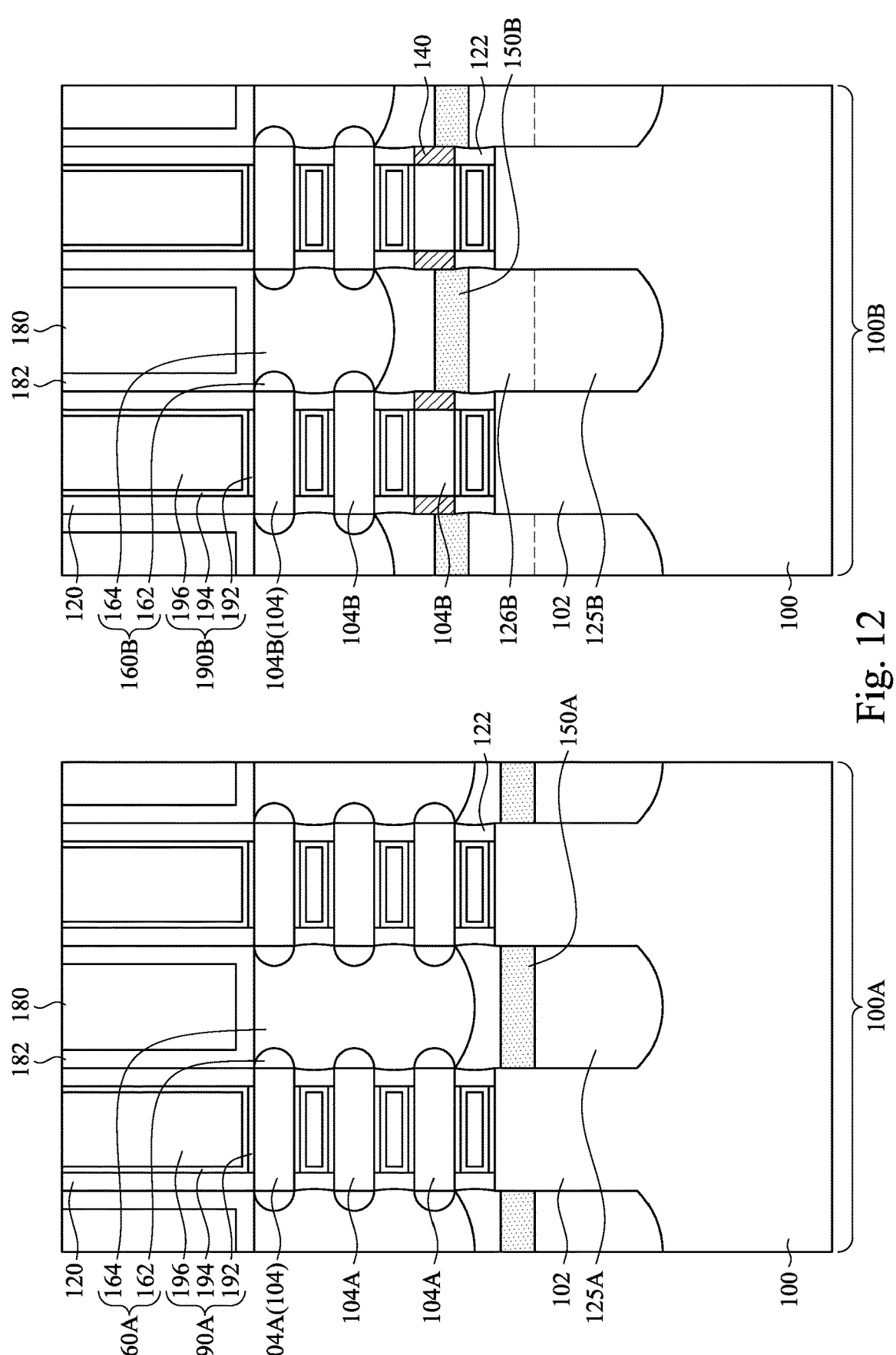

Reference is made to FIG. 12. A contact etching stop layer (CESL) 182 and an interlayer dielectric (ILD) layer 180 are formed over the substrate 100 and covering the source/drain epitaxy structures 160A and 160B. In some embodiments, the CESL 182 and the ILD layer 180 can be formed by, for example, depositing a plurality of dielectric layers over the substrate 100, followed by a CMP process to remove the excessive dielectric materials until the dummy gate structures 110A and 110B are exposed. The CESL 182 may be a dielectric layer including silicon nitride, silicon oxynitride or other suitable materials. In some embodiments, the ILD layer 180 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes(BCB), or polyimide. The CESL 182 and the ILD layer 180 may be formed using, for example, CVD, ALD, spin-on-glass (SOG) or other suitable techniques.

The dummy gate structures 110A and 110B are removed to form gate trenches between each pair of the gate spacers 120. Then, portions of the semiconductor layers 103A and 103B exposed through the gate trenches are removed, such that semiconductor layers 104A and 104B are suspended over the substrate 100.

Metal gate structures 190A and 190B are formed over the substrate 100. In greater details, metal gate structures 190A are formed in the gate trenches between the gate spacers 120 within the first region 100A of the substrate 100, and wrap around each of the semiconductor layers 104A. Similarly, metal gate structures 190B are formed in the gate trenches between the gate spacers 120 within the second region 100B of the substrate 100, and wrap around each of the semiconductor layers 104B. In some embodiments, portions of the metal gate structures 190A (or 190B) vertically between two adjacent semiconductor layers 104A (or 104B) may include a width in a range from about 5 nm to about 20 nm, and may include a thickness in a range from about 2 nm to about 10 nm.

In some embodiments, the bottom surfaces of the source/drain epitaxy structures 160A are lower than the bottom surfaces of the metal gate structures 190A. However, the bottom surfaces of the source/drain epitaxy structures 160B are higher than the bottom surfaces of the metal gate structures 190B. In some embodiments, the bottom surfaces of the source/drain epitaxy structures 160B are higher than the bottom surfaces of the source/drain epitaxy structures 160A by about 3 nm to about 10 nm.

Each of the metal gate structures 190A and 190B may include an interfacial layer 192, a gate dielectric layer 194, and a gate metal 196 over the gate dielectric layer 194. In some embodiments, the interfacial layer 192 may be oxide, such as silicon oxide. The interfacial layer 192 may be formed by thermal oxidation process, such that the interfacial layer 192 may be selectively formed on exposed surfaces of semiconductor materials, such as the semiconductor layers 104A and 104B, and the semiconductor strips 102. In some embodiments, the thickness of the interfacial layer 192 is in a range from about 0.5 nm to about 4 nm.

The gate dielectric layer 194 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 194 may be formed by CVD, ALD or any suitable method. In some embodiments, the thickness of the gate dielectric layer 194 is in a range from about 0.5 nm to about 4 nm.

The gate metal 196 may include work function metal layer and gate electrode over the work function metal layer(s). In some embodiments, the work function metal layer may be made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function metal layer 144, and for the p-channel FET, one or more of TiAlC, Al, TiAl, TaN, TaAlC, TiN, TiC and Co is used as the work function metal layer. The work function metal layer may be formed by ALD, PVD, CVD, e-beam evaporation, or other suitable process. In some embodiments, the gate electrode may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode may be formed by CVD, ALD, electro-plating, or other suitable method.

After the metal gate structures 190A and 190B, transistors are formed in the first region 100A and the second region 100B of the substrate 100. In greater details, the metal gate structure 190A, the semiconductor layers 104A, and the source/drain epitaxy structures 160A on opposite sides of the metal gate structure 190A may collectively serve as a first transistor over the first region 100A of the substrate 100. The semiconductor layers 104A, which are wrapped by the metal gate structure 190A and are in contact with the source/drain epitaxy structures 160A, may serve as channel layers of the first transistor. In some embodiments, all of the semiconductor layers 104A are in contact with the source/drain epitaxy structures 160A. Accordingly, during operation of the first transistor, current may flow through all of the semiconductor layers 104A.

On the other hand, the metal gate structure 190B, the semiconductor layers 104B, and the source/drain epitaxy structures 160B on opposite sides of the metal gate structure 190B may collectively serve as a second transistor over the second region 100B of the substrate 100. Different from the semiconductor layers 104A, although the bottommost semiconductor layer 104B is wrapped by the metal gate structure 190B, the bottommost semiconductor layer 104B is laterally separated from the source/drain epitaxy structures 160B by the blocking dielectrics 140. Accordingly, current will only flow through parts of the semiconductor layers 104B that are above the bottommost semiconductor layer 104B, because such semiconductor layers 104B are in contact with the source/drain epitaxy structures 160B, and may serve as channel layers of the second transistor. Stated another way, the bottommost semiconductor layer 104B may not serve as a channel layer (in-active) in the second transistor.

In some embodiments of the present disclosure, a first transistor is formed over the first region 100A of the substrate 100, and a second transistor is formed over the second region 100B of the substrate 100. Blocking dielectrics 140 are formed on opposite sides of the bottommost semiconductor layers 104B, so as to electrically isolate the bottommost semiconductor layers 104B from the source/drain epitaxy structures 160B. As a result, the number of channel layers of the second transistor is reduced. With such configuration, transistors having different channel layers are formed on different regions. For example, the first transistor within the first region 100A of the substrate 100 may include three channel layers, while the second transistor within the second 100B of the substrate 100 may include two channel layers. This may enable the designers to customize the sheet numbers for high current application (i.e. first transistor with 3 channel layers) or low power consumption application (i.e. second transistor with 2 channel layers). Accordingly, hybrid channel transistors (including 2 channel layers and 3 channel layers) may be found in a wafer at the same time.

Figure 13:
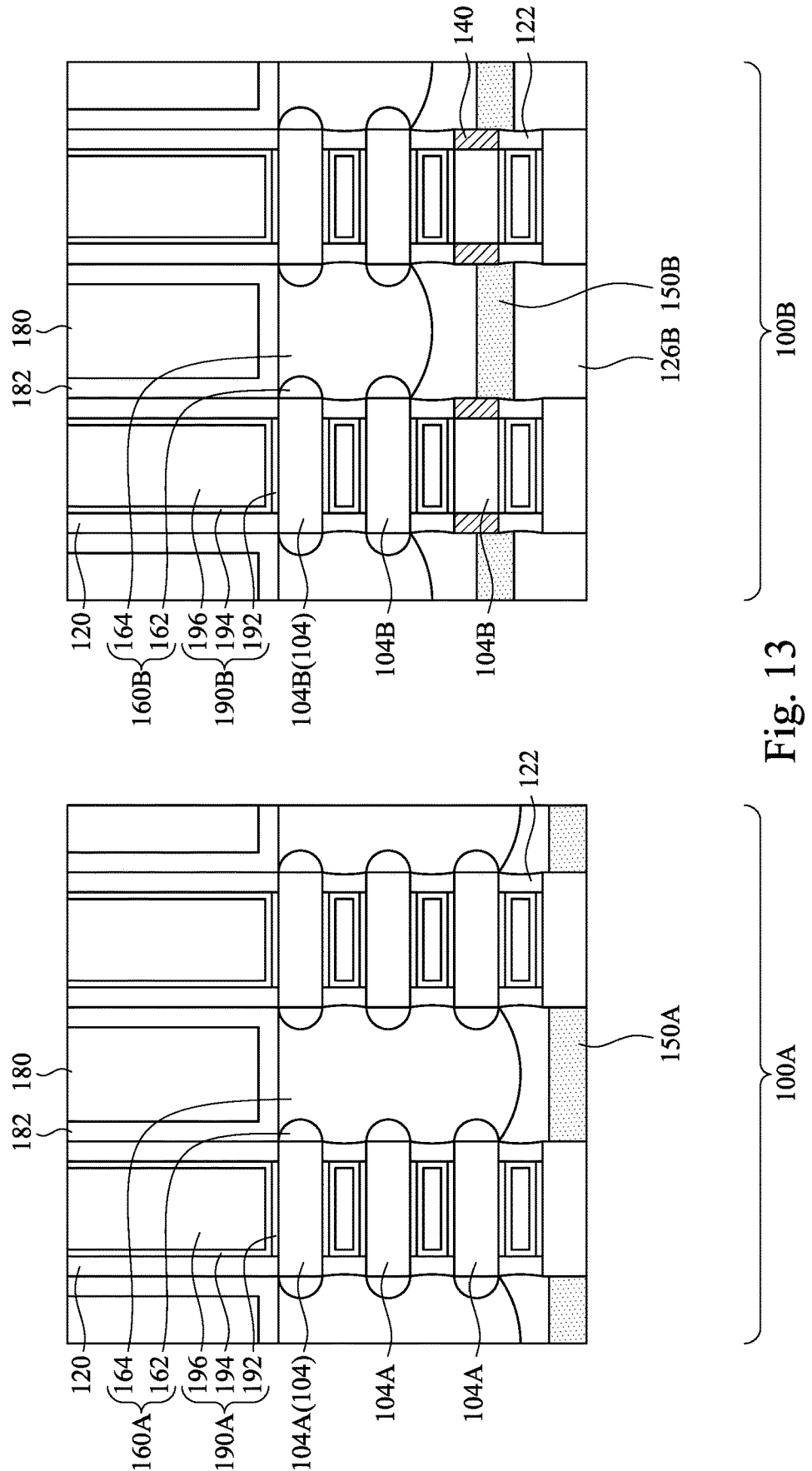

Reference is made to FIG. 13. A grinding process is performed on a backside of the substrate 100, so as to remove portions of the substrate 100 until the semiconductor caps 150A within the first region 100A of the substrate 100 are exposed. However, the semiconductor caps 150B within the second region 100B of the substrate 100 are still covered by the semiconductor materials 126B. It is noted that in the depicted embodiments, the semiconductor materials 126B within the second region 100B of the substrate 100 are exposed after the grinding process is completed, while grinding process may also be stopped at the semiconductor materials 125B (see FIG. 12) in other embodiments. In some embodiments, the grinding process is performed such that bottom surfaces of the semiconductor strips 102 are exposed.

Figure 14:
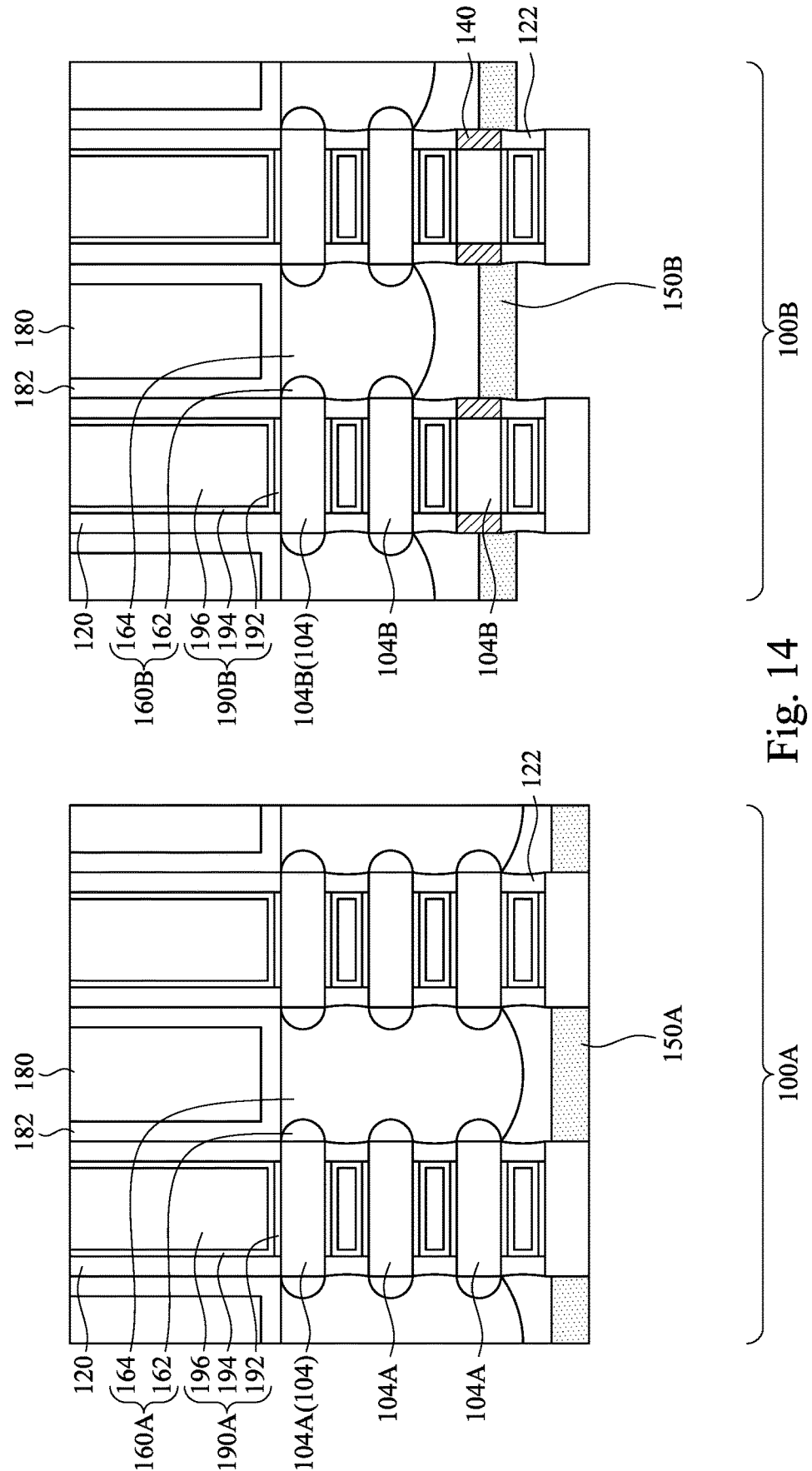

Reference is made to FIG. 14. An etching process is performed to remove the semiconductor materials 126B (and the semiconductor materials 125B, if presented) until the semiconductor caps 150B within the second region 100B of the substrate 100 are exposed. In some embodiments, because semiconductor caps 150A and 150B, and the semiconductor strip 102 are made of a same material, such as silicon, which are different from the material of the semiconductor materials 126B, such as silicon germanium. The semiconductor caps 150A and 150B, and the semiconductor strip 102 may include higher etching resistance to the etching process than the semiconductor materials 126B. In some embodiments, bottommost inner spacers 122 within the second region 100B of the substrate 100 may also be exposed, while bottommost inner spacers 122 within the first region 100A of the substrate 100 may still be covered by the source/drain epitaxy structures 160A.

Figure 15:
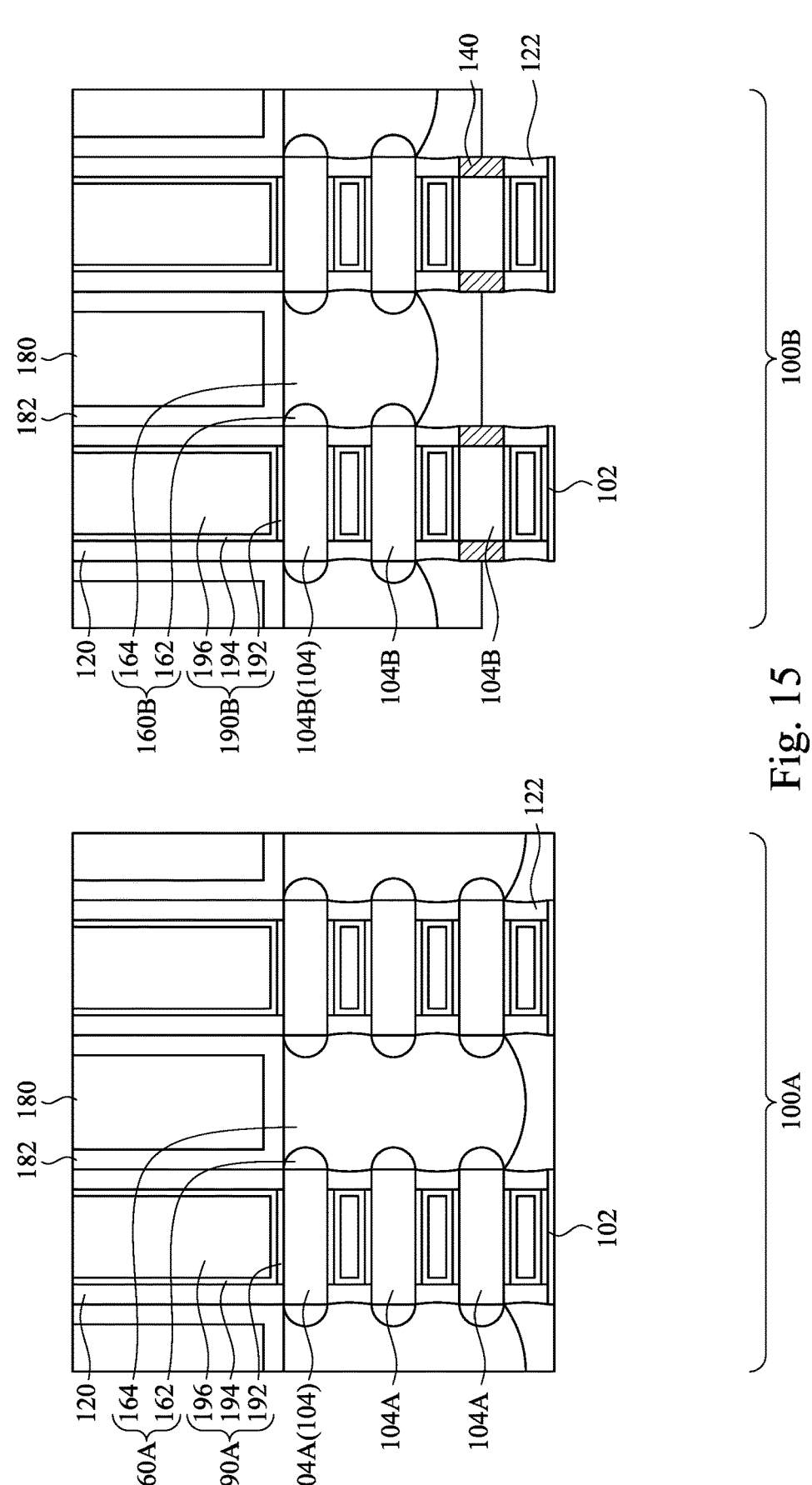

Reference is made to FIG. 15. An etching process is performed to remove the semiconductor caps 150A and 150B, and portions of the semiconductor strip 102. In some embodiments, because semiconductor caps 150A and 150B, and the semiconductor strip 102 are made of a same material, such as silicon, the semiconductor caps 150A and 150B, and the semiconductor strip 102 can be removed in one etching process. As a result, the source/drain epitaxy structures 160A and 160B may be exposed. In some embodiments, the blocking dielectrics 140 may also be exposed. In some embodiments, portions of the semiconductor strips 102 may remain.

Figure 16:
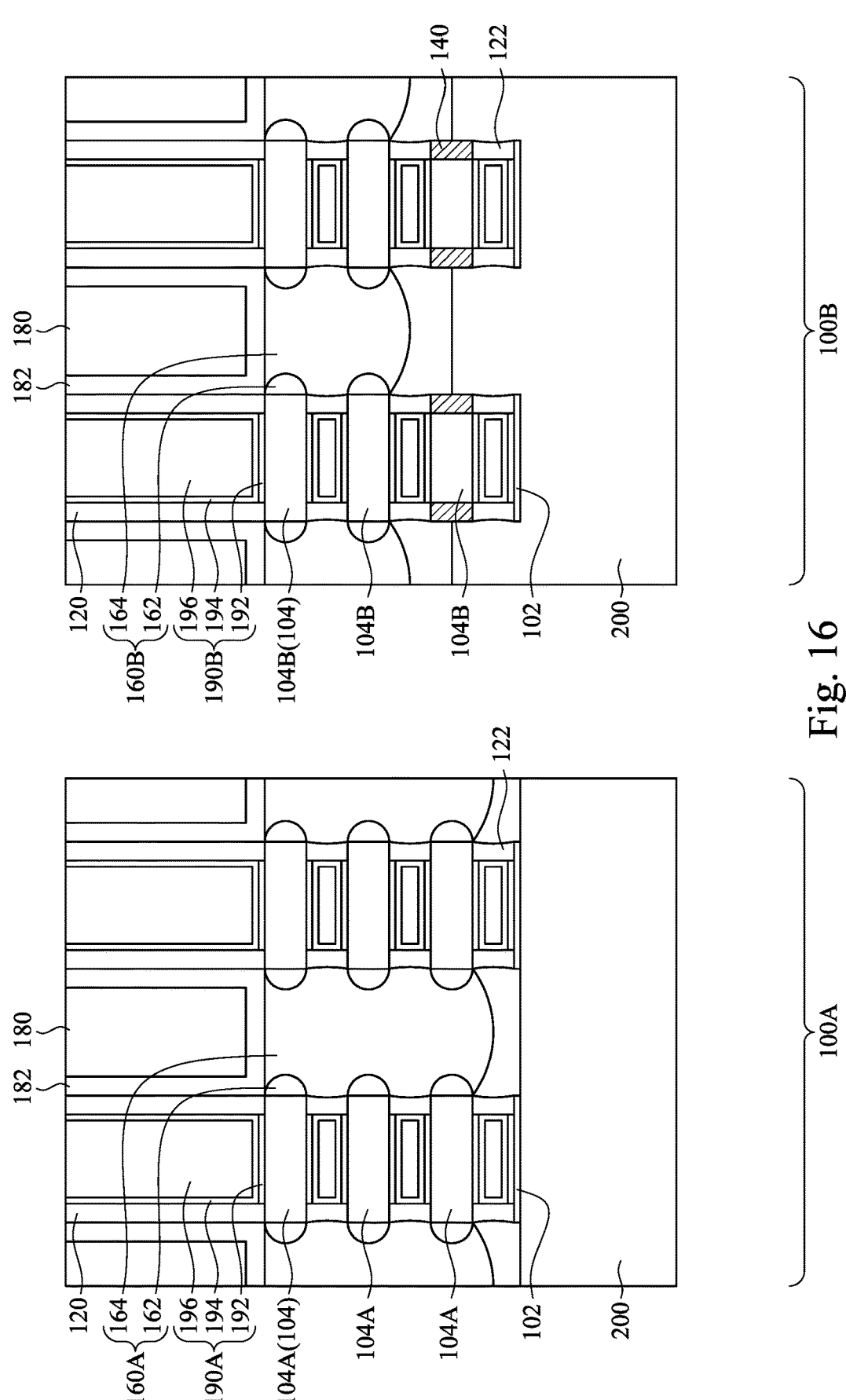

Reference is made to FIG. 16. A dielectric layer 200 is formed. In greater details, the dielectric layer 200 may be formed in contact with the source/drain epitaxy structures 160A and 160B. Moreover, portion of the dielectric layer 200 within the second region 100B of the substrate 100 may be in contact with the blocking dielectrics 140. In some embodiments, the dielectric layer 200 may be made of SiN, SiOCN, SiCN, SIOC, or the like. In some embodiments, the dielectric layer 200 and the blocking dielectrics 140 may be made of a same material. In some embodiments, the processes described in FIGS. 13 to 16 may be omitted.

FIGS. 17 to 24 are cross-sectional views of intermediate stages in the manufacturing of a semiconductor device, in accordance with some embodiments. It is noted that some elements of FIGS. 17 to 24 are similar to those described with respect to FIGS. 2 to 16, such elements are labeled the same and relevant details will not be repeated for brevity.

Figure 17:
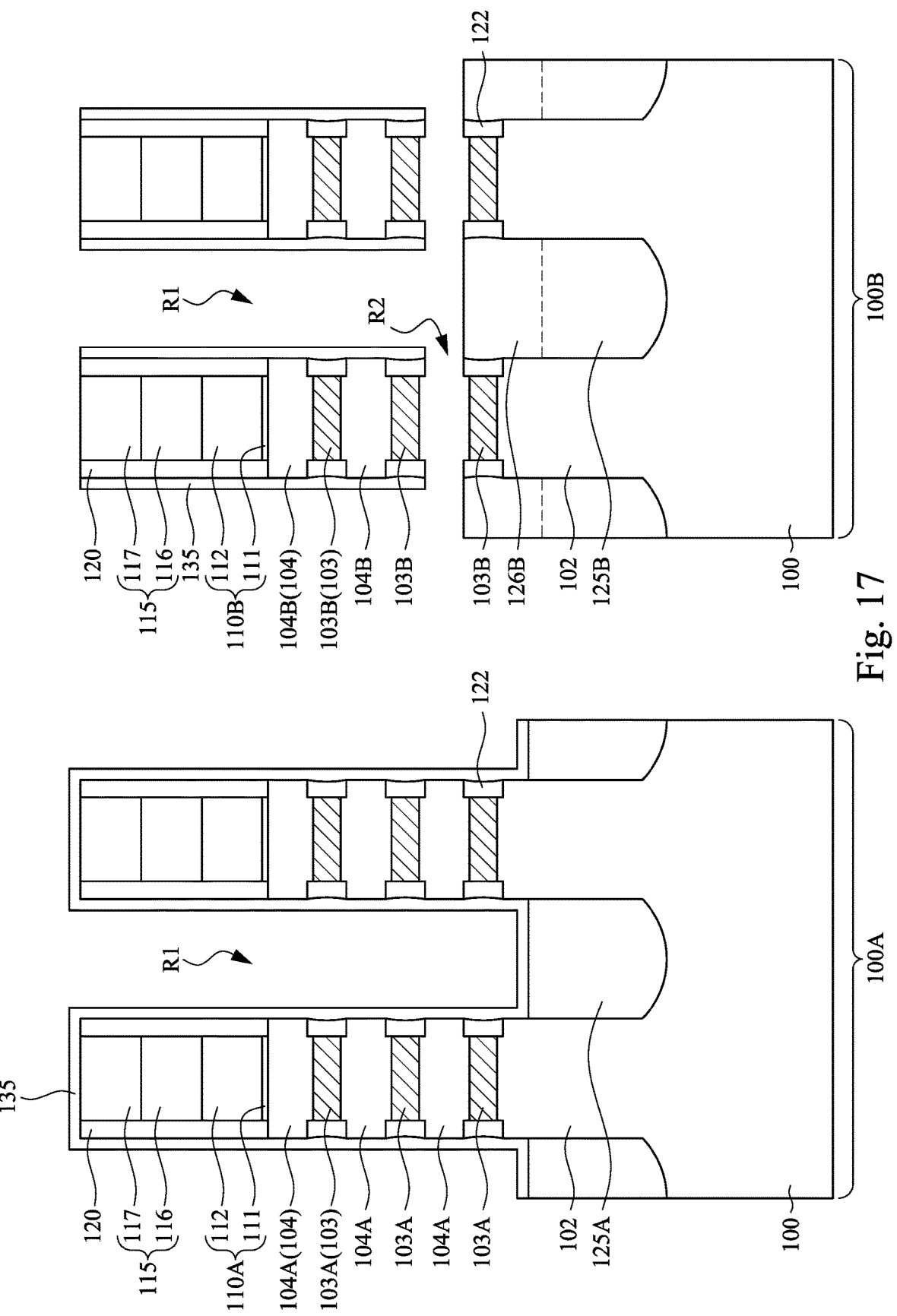
FIGS. 17 to 24 are cross-sectional views of intermediate stages in the manufacturing of a semiconductor device, in accordance with some embodiments.

Reference is made to FIG. 17. It is noted that FIG. 17 is similar to FIG. 8, in which an etching process is performed. The difference between FIG. 17 and FIG. 8 is that the etching process is performed to remove bottommost semiconductor layer 104B within the second region 100B of the substrate 100. More specifically, an entirety of the bottommost semiconductor layer 104B is removed. Accordingly, gaps R2 is formed vertically between the bottommost two of the semiconductor layers 103B.

Figure 18:
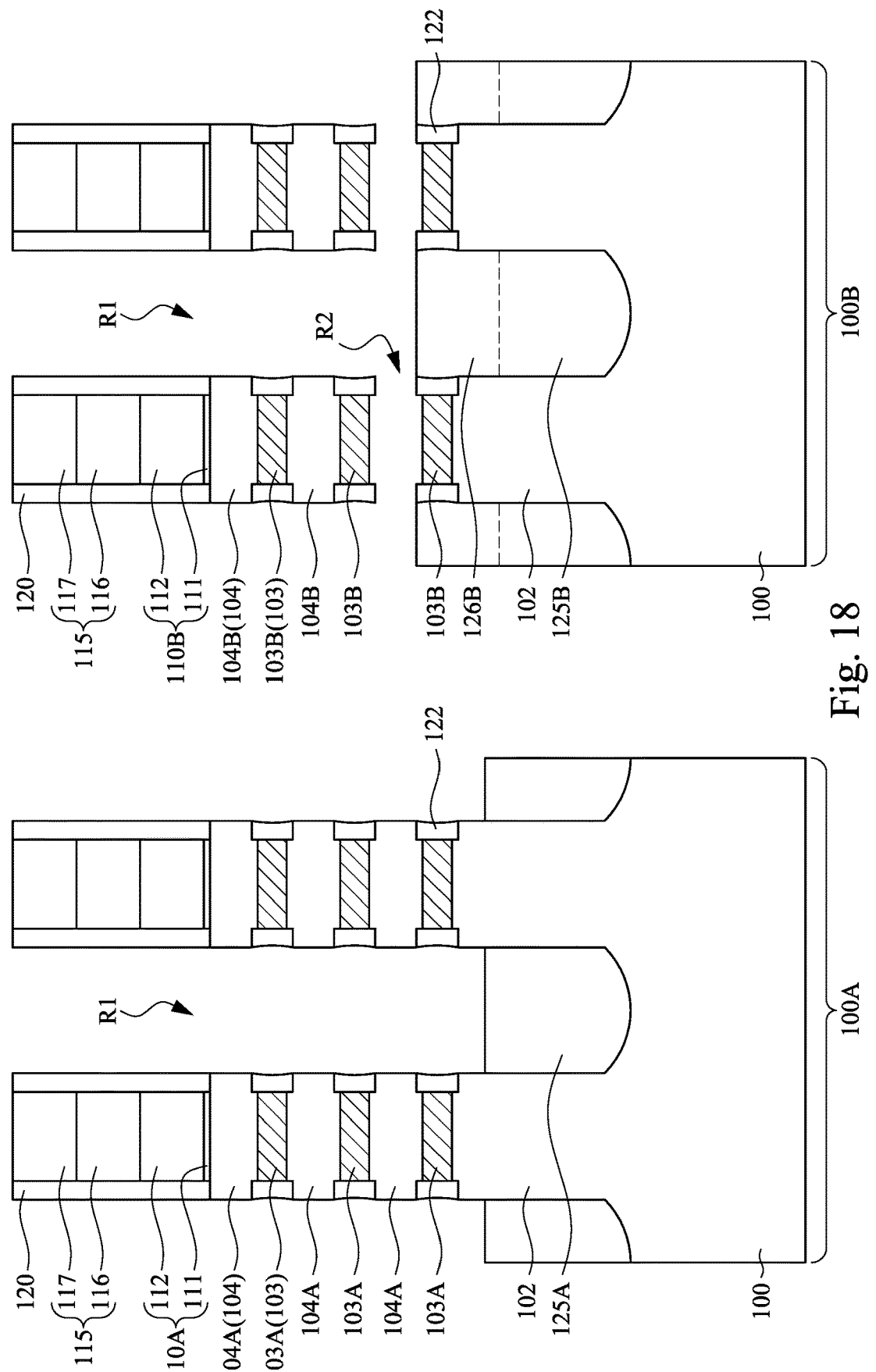

Reference is made to FIG. 18. The spacer layer 135 is removed by suitable process, such as etching. After the spacer layer 135 is removed, the semiconductor layers 104A and the semiconductor layers 104B are exposed.

Figure 19:
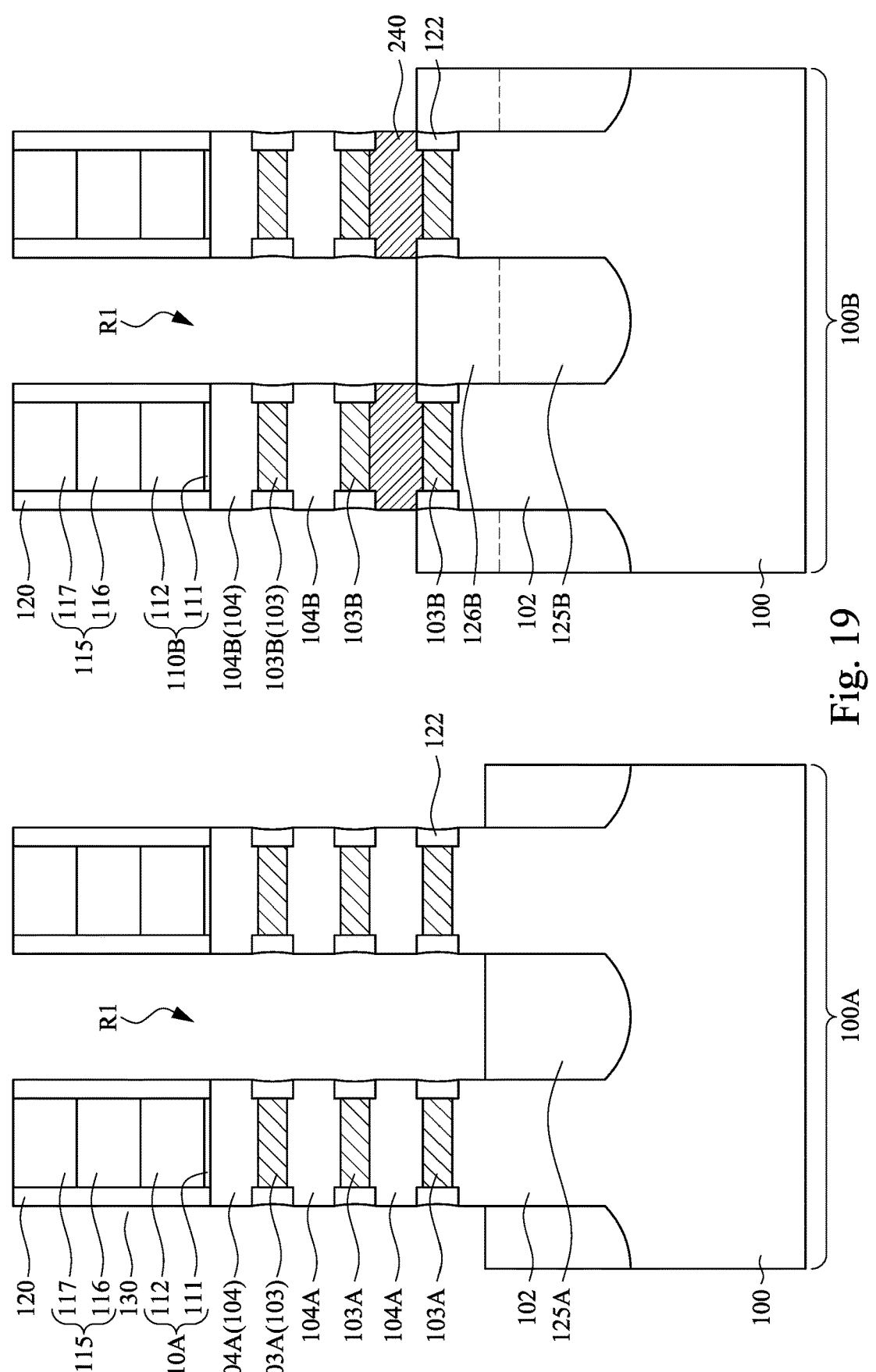

Reference is made to FIG. 19. Blocking dielectrics 240 are formed between the bottommost two of the semiconductor layers 103B. In some embodiments, the blocking dielectrics 240 may be formed by, for example, depositing a dielectric material blanket over the substrate 100 and filling the gaps R2 vertically between the bottommost two of the semiconductor layers 103B, and then performing an etching process to remove portions of the dielectric material outside the gaps R2 vertically between the bottommost two of the semiconductor layers 103B. In some embodiments, each of the blocking dielectrics 240 may be vertically between two adjacent inner spacers 122. In some embodiments, the blocking dielectrics 240 may be made of SiN, SiOCN, SiCN, SIOC, or the like. In some embodiments, the bottommost semiconductor layer 104B is replaced with the blocking dielectrics 240.

Figure 20:
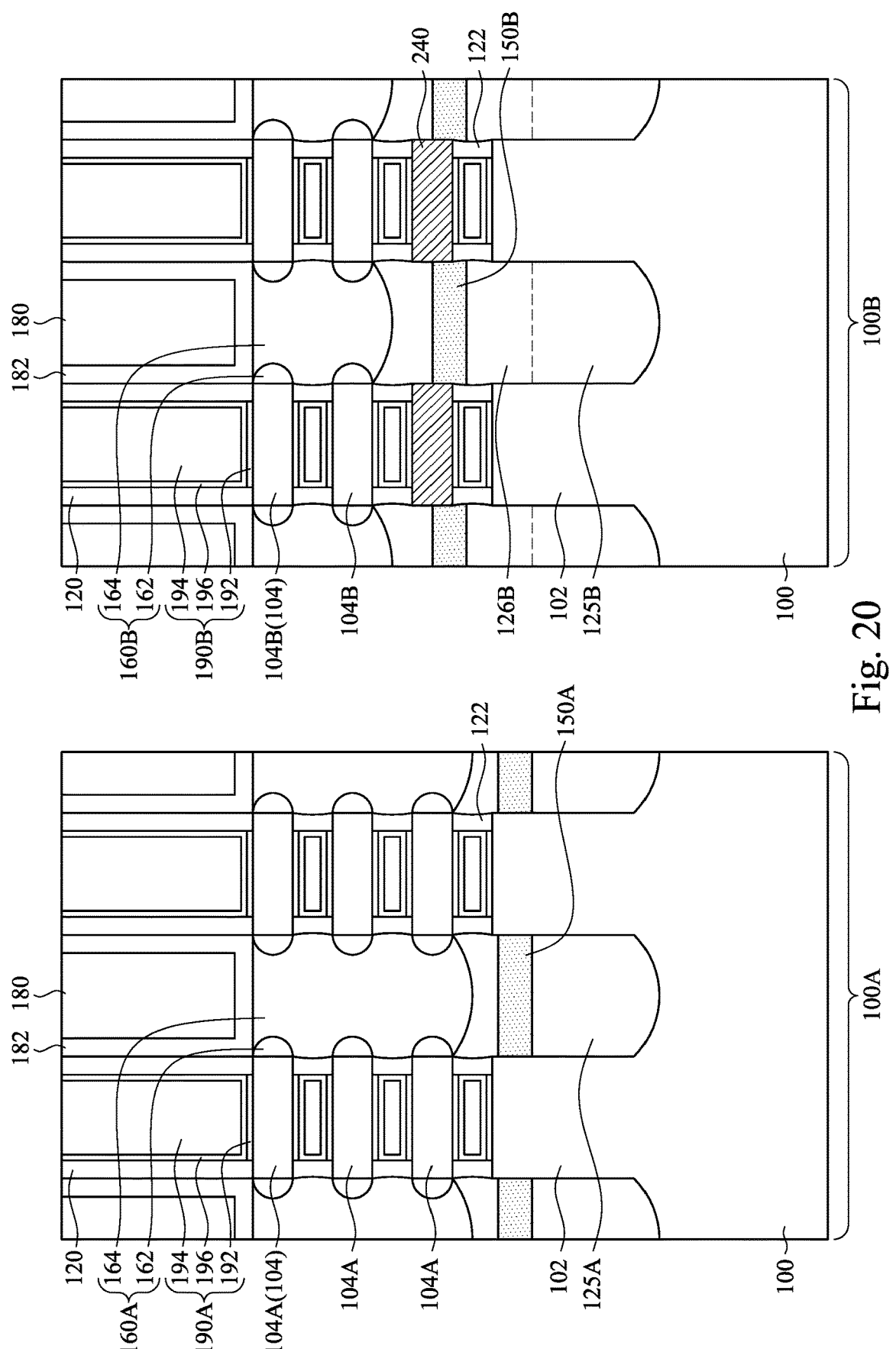

Reference is made to FIG. 20. The structure of FIG. 19 may undergo the processes as described in FIGS. 11 and 12, and thus relevant details will not be repeated for brevity. For example, semiconductor caps 150A and 150B are formed, in which the semiconductor caps 150B may be in contact with the blocking dielectrics 240. Source/drain epitaxy structures 160A and 160B are formed. CESL 182 and ILD layer 180 are formed. Then, the dummy gate structures 110A and 110B are removed to form gate trenches between each pair of the gate spacers 120. Then, portions of the semiconductor layers 103A and 103B exposed through the gate trenches are removed, such that semiconductor layers 104A and 104B are suspended over the substrate 100.

Metal gate structures 190A and 190B are formed over the substrate 100. In greater details, metal gate structures 190A are formed in the gate trenches between the gate spacers 120 within the first region 100A of the substrate 100, and wrap around each of the semiconductor layers 104A. Similarly, metal gate structures 190B are formed in the gate trenches between the gate spacers 120 within the second region 100B of the substrate 100, and wrap around each of the semiconductor layers 104B. In some embodiments, the metal gate structures 190B may also wrap around a corresponding one of the blocking dielectrics 240.

In some embodiments of the present disclosure, a first transistor is formed over the first region 100A of the substrate 100, and a second transistor is formed over the second region 100B of the substrate 100. Blocking dielectrics 240 are formed to replace the bottommost semiconductor layer 104B. As a result, the number of channel layers of the second transistor is reduced. With such configuration, transistors having different channel layers are formed on different regions. For example, the first transistor within the first region 100A of the substrate region 100 may include three channel layers, while the second transistor within the second region 100B of the substrate 100 may include two channel layers. This may enable the designers to customize the sheet numbers for high current application (i.e. first transistor with 3 channel layers) or low power consumption application (i.e. second transistor with 2 channel layers). Accordingly, hybrid channel transistors (including 2 channel layers and 3 channel layers) may be found in a wafer at the same time.

Figure 21:
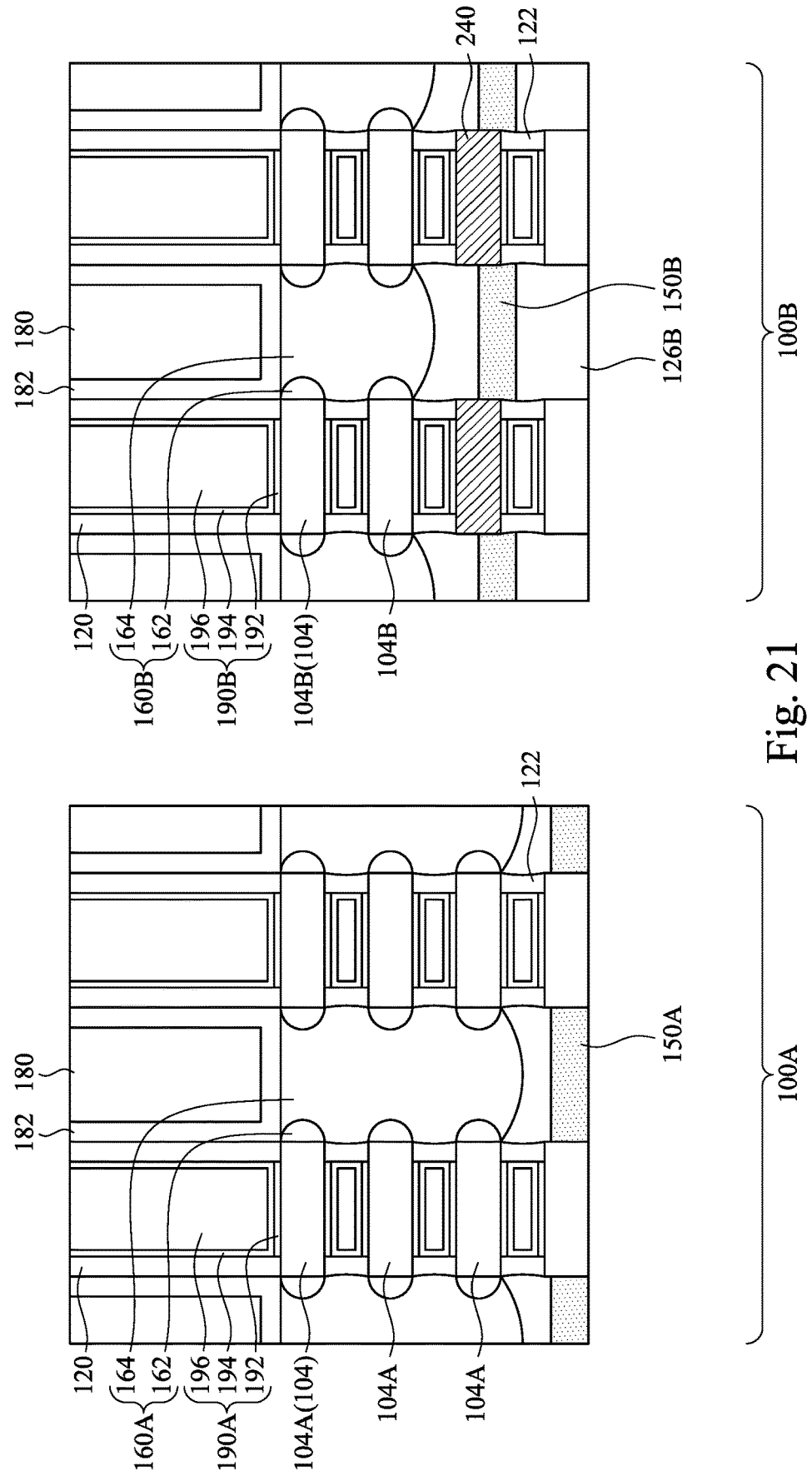

Reference is made to FIG. 21. A grinding process is performed on a backside of the substrate 100, so as to remove portions of the substrate 100 until the semiconductor caps 150A within the first region 100A of the substrate 100 are exposed. However, the semiconductor caps 150B within the second region 100B of the substrate 100 are still covered by the semiconductor materials 126B. It is noted that in the depicted embodiments, the semiconductor materials 126B within the second region 100B of the substrate 100 are exposed after the grinding process is completed, while grinding process may also be stopped at the semiconductor materials 125B (see FIG. 20) in other embodiments. In some embodiments, the grinding process is performed such that bottom surfaces of the semiconductor strips 102 are exposed.

Figure 22:
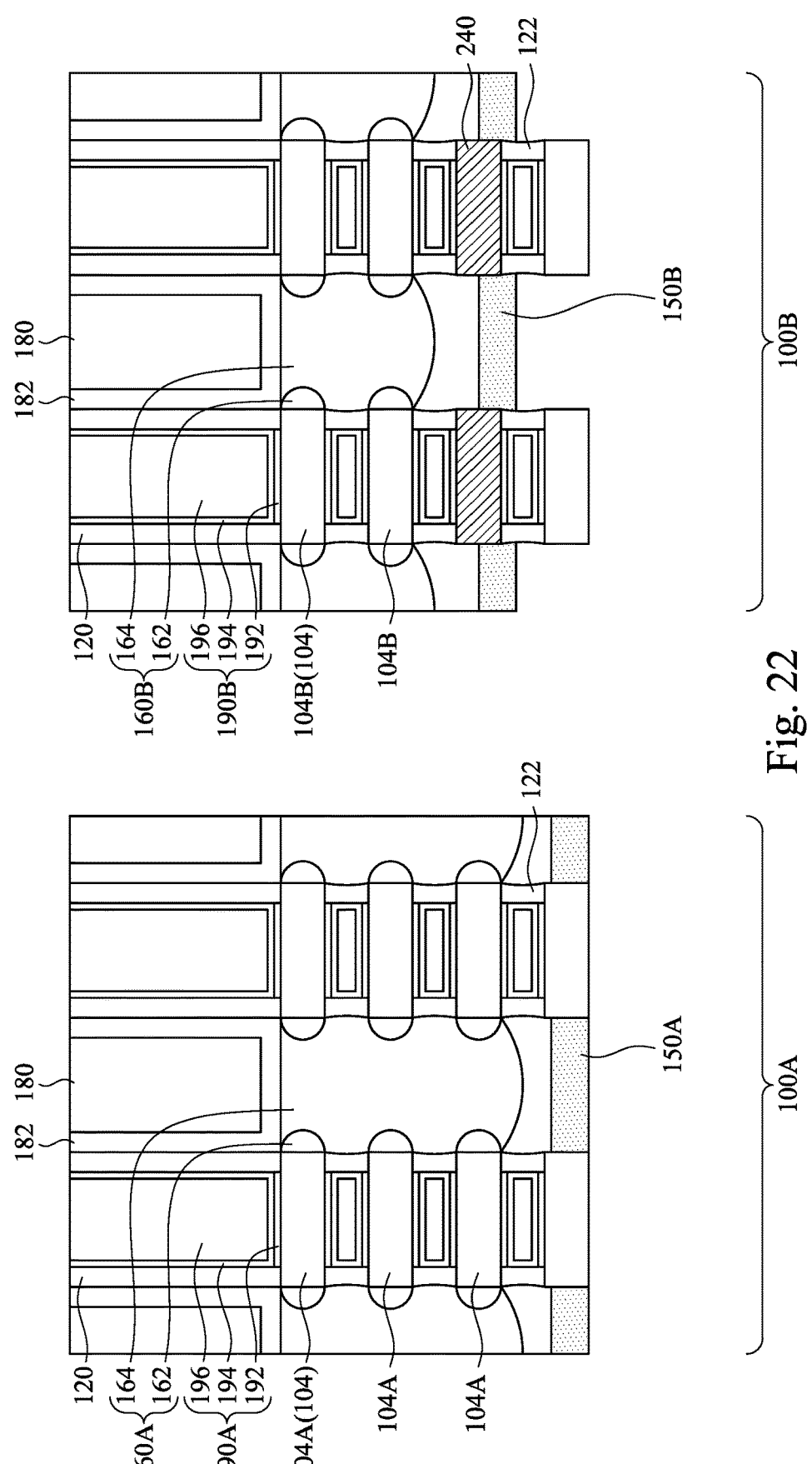

Reference is made to FIG. 22. An etching process is performed to remove the semiconductor materials 126B (and the semiconductor materials 125B, if presented) until the semiconductor caps 150B within the second region 100B of the substrate 100 are exposed. In some embodiments, because semiconductor caps 150A and 150B, and the semiconductor strip 102 are made of a same material, such as silicon, which are different from the material of the semiconductor materials 126B, such as silicon germanium. The semiconductor caps 150A and 150B, and the semiconductor strip 102 may include higher etching resistance to the etching process than the semiconductor materials 126B. In some embodiments, bottommost inner spacers 122 within the second region 100B of the substrate 100 may also be exposed, while bottommost inner spacers 122 within the first region 100A of the substrate 100 may still be covered by the source/drain epitaxy structures 160A.

Figure 23:
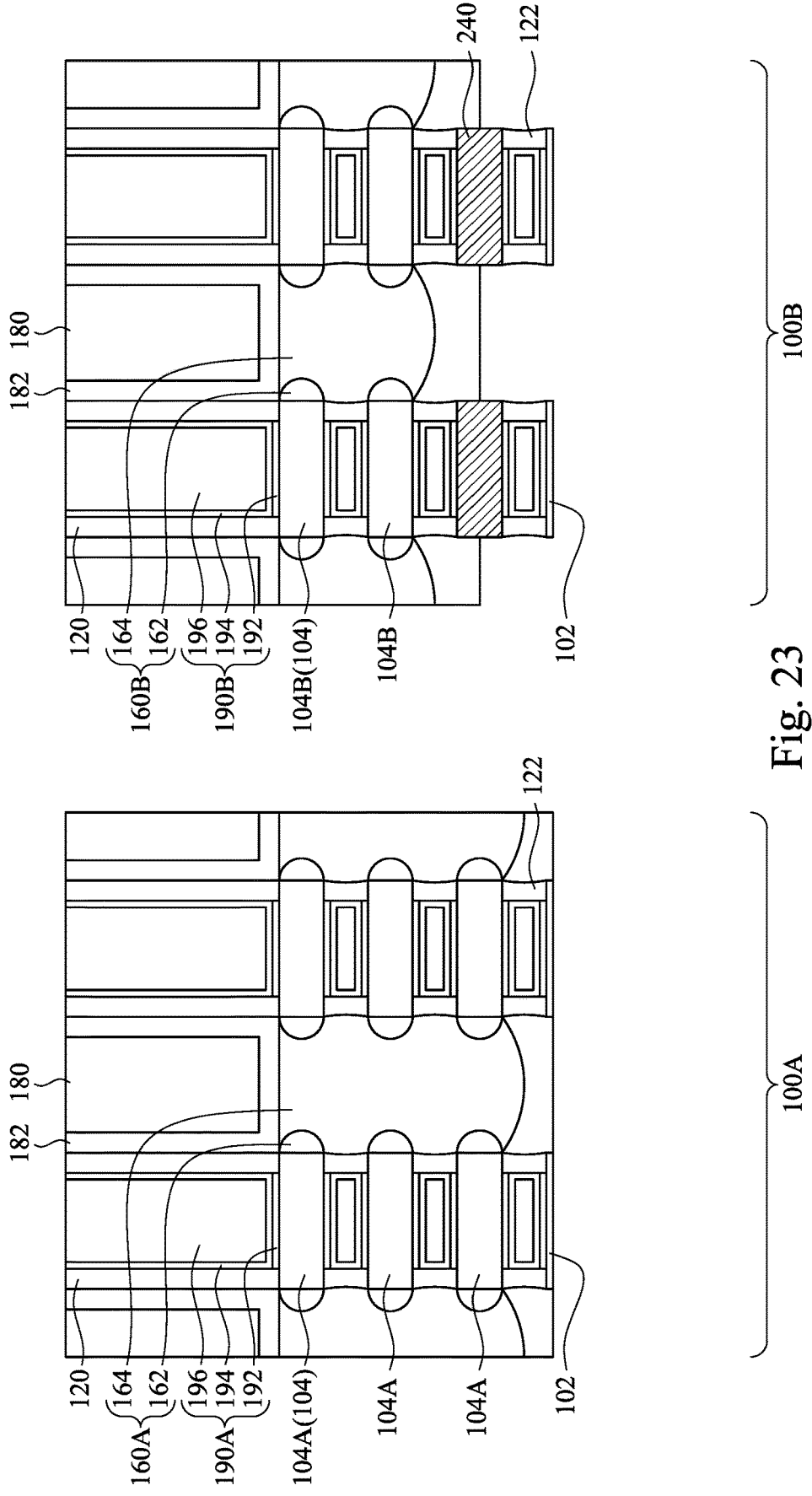

Reference is made to FIG. 23. An etching process is performed to remove the semiconductor caps 150A and 150B, and the semiconductor strip 102. In some embodiments, because semiconductor caps 150A and 150B, and the semiconductor strip 102 are made of a same material, such as silicon, the semiconductor caps 150A and 150B, and the semiconductor strip 102 can be removed in one etching process. As a result, the source/drain epitaxy structures 160A and 160B may be exposed. In some embodiments, the blocking dielectrics 240 may also be exposed. In some embodiments, portions of the semiconductor strips 102 may remain.

Figure 24:
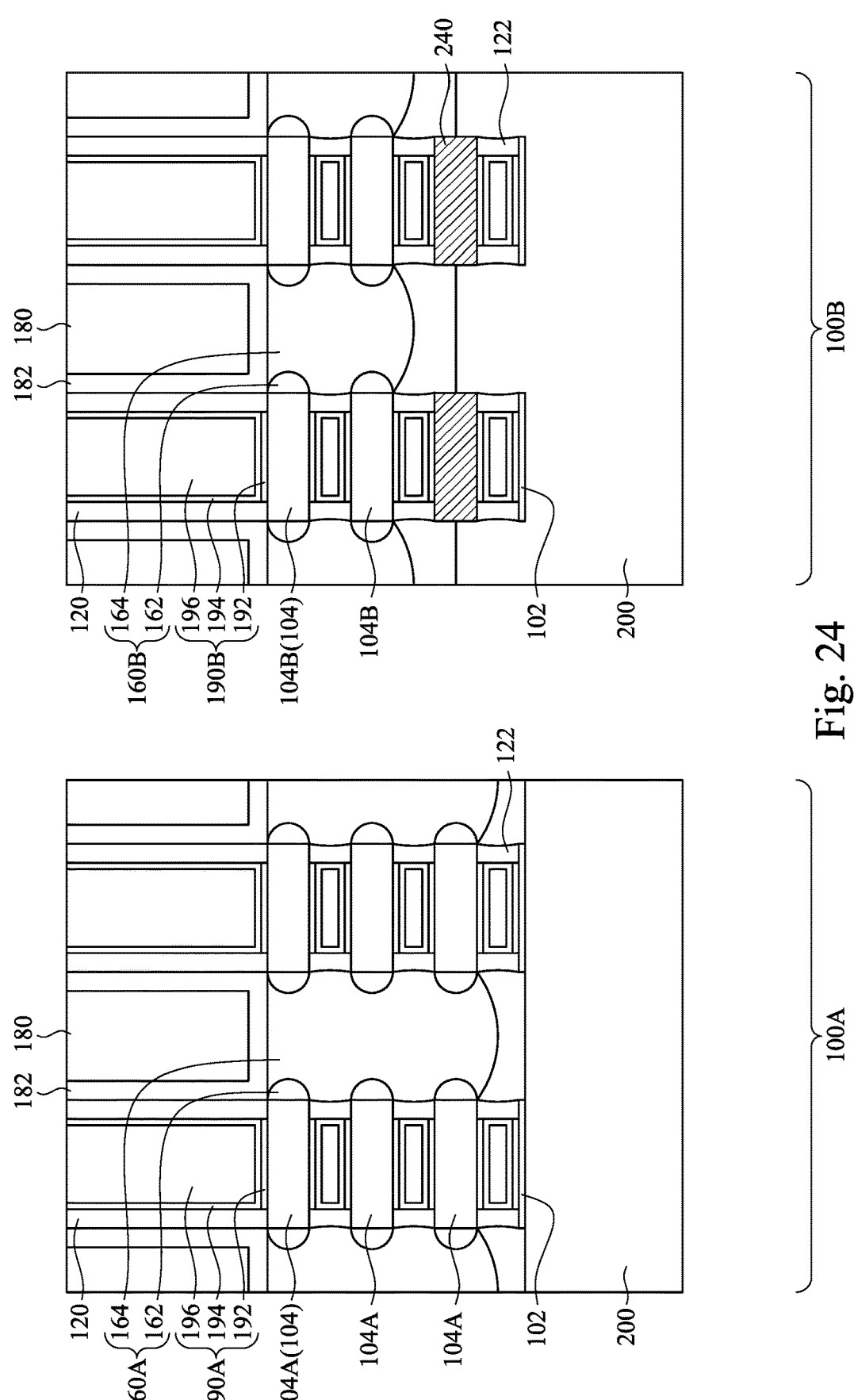

Reference is made to FIG. 24. A dielectric layer 200 is formed. In greater details, the dielectric layer 200 may be formed in contact with the source/drain epitaxy structures 160A and 160B. Moreover, portion of the dielectric layer 200 within the second region 100B of the substrate 100 may be in contact with the blocking dielectrics 140. In some embodiments, the dielectric layer 200 may be made of SiN, SiOCN, SiCN, SIOC, or the like. In some embodiments, the dielectric layer 200 and the blocking dielectrics 240 may be made of a same material.

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments of the disclosure provide a method for reducing a number of channel layers of a transistor. The method includes forming blocking dielectrics on opposite sides of the bottommost semiconductor layer, and include replacing the bottommost semiconductor layer with blocking dielectrics. With such configuration, transistors having different channel layers are formed on different regions of a substrate. For example, a first transistor including three channel layers may be formed over a first region of the substrate, while a second transistor including two channel layers may be formed over a second region of the substrate. This may enable the designers to customize the sheet numbers for high current application (i.e. first transistor with 3 channel layers) or low power consumption application (i.e. second transistor with 2 channel layers). Accordingly, hybrid channel transistors (including 2 channel layers and 3 channel layers) may be found in a wafer at the same time.

In some embodiments of the present disclosure, a method includes forming first semiconductor layers vertically stacked over a substrate; forming a gate structure over the first semiconductor layers; etching portions of the first semiconductor layers and the substrate uncovered by the substrate to form recesses; forming a spacer layer covering sidewalls of portions of the first semiconductor layers, while a bottommost one of the first semiconductor layers is uncovered by the spacer layer; etching the bottommost one of the first semiconductor layers to form a gap; forming a blocking dielectric in the gap; and forming source/drain epitaxy structures in the recesses and on opposite sides of the gate structure.

In some embodiments, etching the bottommost one of the first semiconductor layers is performed to shorten the bottommost one of the first semiconductor layers, and the blocking dielectric electrically isolate the bottommost one of the first semiconductor layers from one of the source/drain epitaxy structures.

In some embodiments, etching the bottommost one of the first semiconductor layers is performed to remove an entirety of the bottommost one of the first semiconductor layers.

In some embodiments, the method further includes forming second semiconductor layers over the substrate, such that the first semiconductor layers and the second semiconductor layers are alternately stacked over the substrate; removing the gate structure after forming the source/drain epitaxy structures; removing the second semiconductor layers, such that portions of the first semiconductor layers are suspended over the substrate; and forming a metal gate structure wrapping the portions of the first semiconductor layers and the at least one blocking dielectric.

In some embodiments, the method further includes removing the spacer layer after etching the bottommost one of the first semiconductor layers and prior to forming the blocking dielectric.

In some embodiments, the method further includes forming first semiconductor materials in the recesses and covering opposite sidewalls of the bottommost one of the first semiconductor layers prior to forming the spacer layer, wherein etching the bottommost one of the first semiconductor layers further comprises etching the first semiconductor materials.

In some embodiments, the method further includes forming second semiconductor materials in the recesses prior to forming the first semiconductor materials, wherein the first and second semiconductor materials are made of different semiconductor materials.

In some embodiments, the method further includes forming semiconductor caps over the second semiconductor materials after etching the bottommost one of the first semiconductor layers and the first semiconductor materials; performing a grinding process to a backside of the substrate until the second semiconductor materials are exposed; removing the second semiconductor materials to expose the semiconductor caps; removing the semiconductor caps to expose the source/drain epitaxy structures; and forming a dielectric layer in contact with the source/drain epitaxy structures.

In some embodiments of the present disclosure, a method includes forming first semiconductor layers vertically stacked over a first region of a substrate and second semiconductor layers vertically stacked over a second region of the substrate; forming a first gate structure over the first semiconductor layers and a second gate structure over the second semiconductor layers; etching the first semiconductor layers and the second semiconductor layers to form first recesses in the first semiconductor layers and second recesses in the second semiconductor layers; etching a bottommost one of the second semiconductor layers to form a gap; forming a blocking dielectric in the gap; and forming first source/drain epitaxy structures in the first recesses and second source/drain epitaxy structures in the second recess.

In some embodiments, the method further includes forming a hard mask layer lining the first recesses and covering the first semiconductor layers; forming first semiconductor materials in the second recesses; and forming second semiconductor materials over the first semiconductor materials and in contact with opposite sides of the bottommost one of the second semiconductor layers, wherein etching the bottommost one of the second semiconductor layers comprises etching the second semiconductor materials.

In some embodiments, the method further includes forming third semiconductor materials in the first recesses and fourth semiconductor materials in the second recesses prior to forming the hard mask layer, wherein the hard mask layer covers top surfaces of the third semiconductor materials.

In some embodiments, the method further includes removing the hard mask layer; forming spacer layer covering the first semiconductor layers and the second semiconductor layers; forming a patterned photoresist covering the first region of the substrate and exposing the second region of the substrate; etching the spacer layer to expose the second semiconductor materials; removing the patterned photoresist prior to etching the bottommost one of the second semiconductor layers; and removing the spacer layer prior to forming the blocking dielectric.

In some embodiments, the method further includes forming first semiconductor caps in the first recesses and second semiconductor caps in the second recesses prior to forming the first and second source/drain epitaxy structures; performing a grinding process to a backside of the substrate until the first semiconductor caps and the second semiconductor materials are exposed; removing the second semiconductor materials to expose the second semiconductor caps; removing the first and second semiconductor caps to expose the first and second source/drain epitaxy structures; and forming a dielectric layer in contact with the first and second source/drain epitaxy structures.

In some embodiments, etching the bottommost one of the second semiconductor layers is performed to remove an entirety of the bottommost one of the second semiconductor layers.

In some embodiments, the method further includes forming inner spacers vertically between the second semiconductor layers, wherein the blocking dielectric is in contact with portions of the inner spacers.

In some embodiments of the present disclosure, a device includes a substrate, first semiconductor layers vertically stacked over the substrate, a first gate structure wrapping around each of the first semiconductor layers, blocking dielectrics on opposite sides of a bottommost one of the first semiconductor layers, and first source/drain epitaxy structures on opposite sides of the first gate structure, in which the bottommost one of the first semiconductor layers are separated from the first source/drain epitaxy structures by the blocking dielectrics.

In some embodiments, the device further includes semiconductor caps over the substrate and below the first source/drain epitaxy structures.

In some embodiments, the device further includes semiconductor materials over the substrate and below the semiconductor caps.

In some embodiments, the device further includes second semiconductor layers vertically stacked over the substrate, a second gate structure wrapping around each of the second semiconductor layers, and second source/drain epitaxy structures on opposite sides of the second gate structure, wherein a bottommost one of the second semiconductor layers is at a same level as the bottommost one of the first semiconductor layers and is in contact with the second source/drain epitaxy structures.

In some embodiments, the device further includes a dielectric layer in contact with bottom surfaces of the first source/drain epitaxy structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming first semiconductor layers vertically stacked over a substrate;
   forming a gate structure over the first semiconductor layers;
   etching portions of the first semiconductor layers and the substrate uncovered by the gate structure to form recesses;
   forming a spacer layer covering sidewalls of portions of the first semiconductor layers, while a bottommost one of the first semiconductor layers is uncovered by the spacer layer;
   etching the bottommost one of the first semiconductor layers to form a gap;
   forming a blocking dielectric in the gap; and
   forming source/drain epitaxy structures in the recesses and on opposite sides of the gate structure.

2. The method of claim 1, wherein etching the bottommost one of the first semiconductor layers is performed to shorten the bottommost one of the first semiconductor layers, and the blocking dielectric electrically isolate the bottommost one of the first semiconductor layers from one of the source/drain epitaxy structures.

3. The method of claim 1, wherein etching the bottommost one of the first semiconductor layers is performed to remove an entirety of the bottommost one of the first semiconductor layers.

4. The method of claim 3, further comprising:
   forming second semiconductor layers over the substrate, such that the first semiconductor layers and the second semiconductor layers are alternately stacked over the substrate;
   removing the gate structure after forming the source/drain epitaxy structures;
   removing the second semiconductor layers, such that portions of the first semiconductor layers are suspended over the substrate; and
   forming a metal gate structure wrapping the portions of the first semiconductor layers and the at least one blocking dielectric.

5. The method of claim 1, further comprising removing the spacer layer after etching the bottommost one of the first semiconductor layers and prior to forming the blocking dielectric.

6. The method of claim 1, further comprising forming first semiconductor materials in the recesses and covering opposite sidewalls of the bottommost one of the first semiconductor layers prior to forming the spacer layer, wherein etching the bottommost one of the first semiconductor layers further comprises etching the first semiconductor materials.

7. The method of claim 6, further comprising forming second semiconductor materials in the recesses prior to forming the first semiconductor materials, wherein the first and second semiconductor materials are made of different semiconductor materials.

8. The method of claim 7, further comprising:
   forming semiconductor caps over the second semiconductor materials after etching the bottommost one of the first semiconductor layers and the first semiconductor materials;
   performing a grinding process to a backside of the substrate until the second semiconductor materials are exposed;
   removing the second semiconductor materials to expose the semiconductor caps;
   removing the semiconductor caps to expose the source/drain epitaxy structures; and
   forming a dielectric layer in contact with the source/drain epitaxy structures.

9. A method, comprising:
   forming first semiconductor layers vertically stacked over a first region of a substrate and second semiconductor layers vertically stacked over a second region of the substrate;
   forming a first gate structure over the first semiconductor layers and a second gate structure over the second semiconductor layers;
   etching the first semiconductor layers and the second semiconductor layers to form first recesses in the first semiconductor layers and second recesses in the second semiconductor layers;
   etching a bottommost one of the second semiconductor layers to form a gap;
   forming a blocking dielectric in the gap; and
   forming first source/drain epitaxy structures in the first recesses and second source/drain epitaxy structures in the second recess.

10. The method of claim 9, further comprising:
    forming a hard mask layer lining the first recesses and covering the first semiconductor layers;
    forming first semiconductor materials in the second recesses; and
    forming second semiconductor materials over the first semiconductor materials and in contact with opposite sides of the bottommost one of the second semiconductor layers, wherein etching the bottommost one of the second semiconductor layers comprises etching the second semiconductor materials.

11. The method of claim 10, further comprising forming third semiconductor materials in the first recesses and fourth semiconductor materials in the second recesses prior to forming the hard mask layer, wherein the hard mask layer covers top surfaces of the third semiconductor materials.

12. The method of claim 10, further comprising:
    removing the hard mask layer;
    forming spacer layer covering the first semiconductor layers and the second semiconductor layers;
    forming a patterned photoresist covering the first region of the substrate and exposing the second region of the substrate;
    etching the spacer layer to expose the second semiconductor materials;
    removing the patterned photoresist prior to etching the bottommost one of the second semiconductor layers; and
    removing the spacer layer prior to forming the blocking dielectric.

13. The method of claim 12, further comprising:
    forming first semiconductor caps in the first recesses and second semiconductor caps in the second recesses prior to forming the first and second source/drain epitaxy structures;

performing a grinding process to a backside of the substrate until the first semiconductor caps and the second semiconductor materials are exposed;

removing the second semiconductor materials to expose the second semiconductor caps;

removing the first and second semiconductor caps to expose the first and second source/drain epitaxy structures; and forming a dielectric layer in contact with the first and second source/drain epitaxy structures.

14. The method of claim 9, wherein etching the bottommost one of the second semiconductor layers is performed to remove an entirety of the bottommost one of the second semiconductor layers.

15. The method of claim 9, further comprising forming inner spacers vertically between the second semiconductor layers, wherein the blocking dielectric is in contact with portions of the inner spacers.

16. A method, comprising:

forming first semiconductor layers vertically stacked over a substrate;

forming a gate structure over the first semiconductor layers;

etching portions of the first semiconductor layers and the substrate uncovered by the gate structure to form recesses;

replacing a bottommost one of the first semiconductor layers with a blocking dielectric;

forming source/drain epitaxy structures in the recesses and on opposite sides of the gate structure;

removing the substrate to expose the source/drain epitaxy structures; and forming a dielectric layer in contact with the source/drain epitaxy structures.

17. The method of claim 16, further comprising:

forming second semiconductor layers over the substrate, such that the first semiconductor layers and the second semiconductor layers are alternately stacked over the substrate;

removing the gate structure after forming the source/drain epitaxy structures;

removing the second semiconductor layers, such that portions of the first semiconductor layers are suspended over the substrate; and forming a metal gate structure wrapping the portions of the first semiconductor layers and the blocking dielectric.

18. The method of claim 16, further comprising:

prior to replacing the bottommost one of the first semiconductor layers with the blocking dielectric, forming a spacer layer covering sidewalls of portions of the first semiconductor layers, while leaving the bottommost one of the first semiconductor layers exposed; and removing the spacer layer after replacing the bottommost one of the first semiconductor layers with the blocking dielectric.

19. The method of claim 16, wherein the dielectric layer is in contact with the blocking dielectric.

20. The method of claim 16, wherein the dielectric layer is in contact with opposite ends of the blocking dielectric.

\* \* \* \* \*